(12) United States Patent
Schneider et al.

(10) Patent No.: US 9,613,812 B2
(45) Date of Patent: Apr. 4, 2017

(54) METHOD FOR PROCESSING A CARRIER, A CARRIER, AN ELECTRONIC DEVICE AND A LITHOGRAPHIC MASK

(71) Applicant: Infineon Technologies AG, Neubiberg (DE)

(72) Inventors: Jens Schneider, Moritzburg (DE); Henning Feick, Dresden (DE); Marcel Heller, Stolpen (DE); Dieter Kaiser, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 81 days.

(21) Appl. No.: 14/693,900

(22) Filed: Apr. 23, 2015

(65) Prior Publication Data
US 2015/0287599 A1    Oct. 8, 2015

Related U.S. Application Data

(62) Division of application No. 13/771,129, filed on Feb. 20, 2013, now Pat. No. 9,029,049.

(51) Int. Cl.
| *H01L 21/266* | (2006.01) |
| *G03F 1/00* | (2012.01) |
| *G03F 7/20* | (2006.01) |
| *H01L 29/36* | (2006.01) |
| *G01L 1/22* | (2006.01) |
| *H01L 21/027* | (2006.01) |
| *H01L 21/265* | (2006.01) |
| *H01L 43/06* | (2006.01) |
| *H01L 43/14* | (2006.01) |
| *H01L 29/78* | (2006.01) |
| *H01L 29/08* | (2006.01) |
| *H01L 27/02* | (2006.01) |
| *G03F 1/38* | (2012.01) |

(Continued)

(52) U.S. Cl.
CPC .......... *H01L 21/266* (2013.01); *C23C 14/042* (2013.01); *C23C 14/48* (2013.01); *G01L 1/2293* (2013.01); *G03F 1/00* (2013.01); *G03F 1/38* (2013.01); *G03F 7/70058* (2013.01); *H01L 21/0271* (2013.01); *H01L 21/2652* (2013.01); *H01L 27/0255* (2013.01); *H01L 29/0847* (2013.01); *H01L 29/36* (2013.01); *H01L 29/7835* (2013.01); *H01L 43/065* (2013.01); *H01L 43/14* (2013.01); *G03F 1/56* (2013.01); *H01L 21/26586* (2013.01); *H01L 29/8611* (2013.01); *Y10T 428/24802* (2015.01)

(58) Field of Classification Search
CPC ......... C23C 14/04; C23C 14/48; C23C 14/50; H01L 21/266
See application file for complete search history.

(56) References Cited

U.S. PATENT DOCUMENTS

| 2009/0308440 A1* | 12/2009 | Adibi | ............... H01L 21/266 |
| | | | 136/255 |
| 2010/0055882 A1* | 3/2010 | Imhoff | ............... H01L 21/0465 |
| | | | 438/481 |

* cited by examiner

*Primary Examiner* — Stephen Rosasco
(74) *Attorney, Agent, or Firm* — Viering, Jentschura & Partner mbB

(57) ABSTRACT

Various embodiments provide a method for processing a carrier, the method including changing the three-dimensional structure of a mask layer arranged over the carrier so that at least two mask layer regions are formed having different mask layer thicknesses; and applying an ion implantation process to the at least two mask layer regions (Continued)

to form at least two implanted regions in the carrier having different implantation depth profiles.

11 Claims, 16 Drawing Sheets

(51) Int. Cl.
*C23C 14/04* (2006.01)
*C23C 14/48* (2006.01)
*H01L 29/861* (2006.01)
*G03F 1/56* (2012.01)

METHOD FOR PROCESSING A CARRIER, A CARRIER, AN ELECTRONIC DEVICE AND A LITHOGRAPHIC MASK

CROSS-REFERENCE TO RELATED APPLICATIONS

The present application is a divisional of U.S. patent application No. 13/771,129 filed Feb. 20, 2013, the entirety of which is herein incorporated by reference.

TECHNICAL FIELD

Various embodiments relate generally to a method for processing a carrier, to a carrier, to an electronic device, and to a lithographic mask.

BACKGROUND

In general, various methods may be utilized for doping a carrier, or for example doping a silicon wafer. One method for doping a region in a carrier may be ion implantation, wherein the ions enter the carrier material due to their high kinetic energy. To define the regions to be doped, a mask is applied to protect specific areas from ion implantation and to allow ion implantation in specific areas. Manufacturing electronic devices or integrated circuits may generally include a large number of lithographic processes, e.g. more than 20 for example, to generate the patterned photoresist layers as masking layers for defining all necessary doped regions in the carrier. Applying various lithographic processes in series may be prone to errors due to the limited overlay accuracy in lithographic processes.

SUMMARY

According to various embodiments, a method for processing a carrier is provided, wherein the method may include changing a three-dimensional structure of a mask layer arranged over the carrier so that at least two mask layer regions are formed having different mask layer thicknesses; and applying an ion implantation process to the at least two mask layer regions to form at least two implanted regions in the carrier having different implantation depth profiles.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
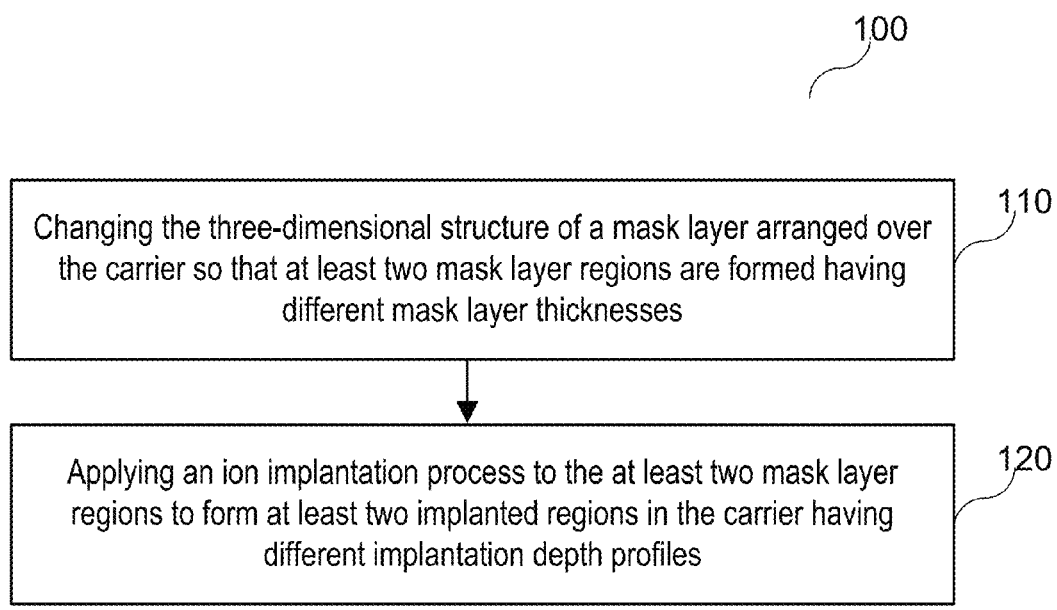
FIG. 1 shows a flow diagram of a method for processing a carrier, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The following description of techniques should be understood as illustrating examples, which techniques may be included in the method for processing a carrier or the method for processing an electronic device, according to various embodiments. The techniques exemplarily described herein may be not necessarily need to be construed as preferred or advantageous over other techniques or methods, since they only serve to illustrate how the invention may be practiced. For sake of brevity the illustration of the techniques exemplarily described herein is only a short overview and should not be considered as exhaustive specification.

According to various embodiments, a layering process (or layering) may be included in the method for processing a carrier. In a layering process, a layer (also referred to as film or thin film) may be deposited over a surface (e.g. over a carrier, over a wafer, over a substrate, over another layer, or the like) using deposition techniques, which may include chemical vapor deposition (CVD, or a CVD process) and physical vapor deposition (PVD, or a PVD process), according to various embodiments (a layering process may therefore include depositing a material). According to various embodiments, the thickness of a deposited layer may be in the range of a few nanometers up to several micrometers depending on its specific function. Further, according to various embodiments, a layer may include at least one of an electrically insulating material, an electrically semiconducting material, and an electrically conductive material, depending on the respective specific function of the layer. According to various embodiments, modifications of PVD and CVD processes may be used in the method for processing a carrier.

It should be noted, that a variety of combinations of the materials and processes may be used within a layering process, according to various embodiments. Depending on specific aspects, as for example crystalline quality, surface roughness, edge covering behavior, growth speed, and yield, the most suitable process may be applied for the respective material, according to various embodiments.

According to various embodiments, a patterning process (or patterning) may be included in the method for processing a carrier. According to various embodiments, a patterning process may include removing selected portions of a surface layer or of a material. After a surface layer may be partially removed, a pattern (or a patterned layer or patterned surface layer) may remain over the underlying structure (e.g. a pattern may remain on a wafer). Since a plurality of processes may be involved, according to various embodiments, there are various possibilities to perform a patterning process, wherein aspects may be: selecting at least one portion of a surface layer (or a material) which shall be removed, e.g. using at least one lithographic process; and removing the selected portions of a surface layer, e.g. using at least one etch process.

According to various embodiments, changing the three-dimensional structure of a mask layer may include removing a portions of the mask layer, in other words changing the three-dimensional structure of a mask layer may include a patterning process.

According to various embodiments, a variety of lithographic processes may be applied to generate a mask layer or a patterned mask layer (a so-called photomask), as for example photolithography, microlithography or nanolithography, electron beam lithography, X-ray lithography, ultraviolet lithography, extreme ultraviolet lithography, interference lithography, and the like. According to various embodiments, a lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer). According to various embodiments, a lithographic process may be modified by using a so-called gray scale mask. According to various embodiments, a gray scale mask may be a lithographic mask including regions having different optical transmittances (e.g. different shades of gray); therefore, compared to conventional lithographic masks, a gray scale mask may not only provide the possibility of exposing (white) an area of a resist layer or not exposing (black) an area of a resist layer. A gray scale mask, according to various embodiments, may provide several mask regions having optical transmittances between the maximal possible transmittance (e.g. about 100%, white) and the minimal possible transmittance (about 0%, black), therefore called gray scale mask. According to various embodiments, a lithographic mask (e.g. a gray scale mask) may be used within an exposure process, wherein the lithographic mask may define the regions to be exposed and the specific intensity of the light for exposing the respective regions.

According to various embodiments, an initial cleaning process or a cleaning process, which may be included in a lithographic process (or which may be included in a general process in semiconductor processing), may be applied to remove organic or inorganic contaminations (or material) from a surface (e.g. from a surface layer, from a carrier, from a wafer, and the like) by for example wet chemical treatment. According to various embodiments, the initial cleaning process or a cleaning process may include at least one of the following processes: RCA (Radio Corporation of America) cleaning (also known as Organic Clean (SC1) and Ionic Clean (SC2)); SCROD (single-wafer spin cleaning with repetitive use of ozonized water and diluted HF); IMEC wafer cleaning; post chemical mechanical polishing (post-CMP) cleaning process; cleaning via de-ionized water (DIW), piranha etch and/or a metal etch; (and the like). According to various embodiments, a cleaning process may also be applied for removing a thin oxide layer (e.g. a thin silicon oxide layer) from a surface (e.g. from a surface layer, from a carrier, or from a wafer, and the like).

According to various embodiments, a preparation process, which may be included in a lithographic process, may be applied to promote the adhesion of the photoresist to a surface (e.g. to a surface layer, to a carrier, or to a wafer, and the like). According to various embodiments, the preparation process may include applying a liquid or gaseous adhesion promoter (e.g. bis(trimethylsilyl)amine (HMDS)).

According to various embodiments, a resist may be applied to cover a surface (e.g. a surface layer, a carrier, or a wafer, and the like). According to various embodiments, applying a resist may include spin coating or spray coating to generate a resist layer. Afterwards, a resist may be prebaked to drive off excess resist solvent, according to various embodiments. According to various embodiments, several types of resists (e.g. a photoresist) may be used adapted to the process of exposing the resist to achieve desired results. According to various embodiments, positive photoresists (e.g. DNQ-Novolac, PMMA, PMIPK, PBS, and the like) may be used, whereby the resist that has been exposed to light becomes soluble to a photoresist developer, and/or negative photoresists (e.g. SU-8, poly isoprene, COP, and the like) may be used, whereby the resist that has been exposed to light becomes insoluble to a photoresist developer.

According to various embodiments, a resist may be exposed (e.g. by exposing a resist to a pattern of light) to transfer a desired pattern to a resist, e.g. using light or electrons, wherein the desired pattern may be defined by a patterned mask (e.g. a glass carrier with a patterned chromium layer). According to various embodiments, mask-less lithography may be applied, wherein a precise beam (e.g. an electron beam or a laser beam) may be projected directly onto the surface including a resist without using a mask. According to various embodiments, the exposure to light may cause a reaction in a resist that may allow that some of the resist may be removed by a special solution (a so-called developer, e.g. a photoresist developer). According to various embodiments, so called gray scale lithography may allow exposing various regions of a resist layer with light having different intensities. Therefore, according to various embodiments, regions of a resist layer may remain after a lithographic process has been carried out, wherein the regions may have different thicknesses.

Since the resolution of an optical imaging process may be limited by the used wavelength, the wavelength of the used light may range from the wavelength of the visible light to smaller wavelengths in the ultra violet range, according to various embodiments. According to various embodiments, the exposure may be performed using x-rays or electrons having even shorter wavelengths than ultra violet light. Projection exposure systems (steppers or scanners) may be used projecting a mask many times onto a surface including a resist to create the complete exposure pattern.

According to various embodiments, a lithographic process may include developing a resist (e.g. developing a photoresist using a photoresist developer) to partially remove the resist to generate a patterned resist layer (e.g. on a surface layer or on a carrier, a wafer, and the like). According to various embodiments, developing a resist may include a post exposure bake (a heat treatment, e.g. rapid thermal processing) before the actual developing process may be performed. According to various embodiments, the developing process may include a special chemical solution (a so-called developer) as for example sodium hydroxide or tetramethylammonium hydroxide (TMAH, a metal ion free developer). According to various embodiments, the patterned resist layer may be solidified in a hard bake process (a heat treatment, e.g. rapid thermal processing), realizing a more durable protecting layer for later processes as for example ion implantation.

Independently from the described lithographic processes, a resist layer may be removed completely at a desired processing stage (e.g. after an ion implantation process) in a so-called resist strip process. According to various embodiments, a resist may be removed chemically and/or by using oxygen plasma.

It should be noted, that a lithographic process, according to various embodiments, including exposing a resist and developing a resist may also be considered as a patterning process, wherein a patterned resist layer (a soft mask, or a resist mask) may be generated by the lithographic process. Further, according to various embodiments, subsequently using an etch process a pattern can be transferred from a patterned resist layer to a prior deposited or grown layer, wherein the previously deposited or grown layer may include a hard mask material as for example an oxide or a nitride (e.g. silicon oxide, e.g. silicon nitride) creating a so-called hard mask.

According to various embodiments, an etch process, which may be included in a patterning process, may be applied to remove material from a prior deposited layer, a grown surface layer, a carrier (or substrate, or wafer), and the like.

According to various embodiments, a patterned layer of a hard mask material may serve as a mask for processes like ion implantation or layering (as a so-called hard mask). Further, according to various embodiments, a patterned photoresist may also serve as a mask (a so-called soft mask). The mask material may usually be selected with regard to specific needs as for example chemical stability or mechanical stability, e.g. to protect regions from being penetrated by ions, or to define the shape of generated structure elements during a layering process, and the like.

Since the desired shapes and structure elements may be generated in their exact dimensions (feature size) during a patterning process, patterning may be the most critical process regarding the reduction of the feature size. Errors during a patterning process may cause a distorted pattern or a misplaced pattern and therefore may change the electrically functioning of a device or of an integrated circuit. Misplacement of a respective structure element (e.g. misplacement of a doped region in a carrier), e.g. due to overlay errors, may have negative effects on the functionality of the structure element. Therefore, the patterning process may define a critical feature size. According to various embodiments, there may be several possibilities to reduce overlay errors, e.g. by reducing the number of involved lithographic processes. According to various embodiments, gray scale lithography or multi exposure gray scale lithography may be utilized to reduce the number of patterning processes, or lithographic process, or exposure processes, which may be necessary to generate complex doping profiles in a carrier, as described later.

According to various embodiments, a doping process may be applied to change the physical properties of a material by adding dopant material, wherein the key aspects may be the electronic properties of the doped material (e.g. the specific electrical conductivity). Various techniques may be applied or adapted to perform a doping process, as for example thermal diffusion and/or ion implantation. Electron doped material may be called n-type (negative-type) and hole doped material may be called p-type (positive type). Ion implantation may be used for doping a material.

According to various embodiments, in a thermal diffusion process, dopant material may be provided to diffuse into a material or within a material, wherein the material may be heated up (e.g. to a temperature in the range from about 600° C. to about 1000° C.) to support diffusion processes, according to various embodiments.

According to various embodiments, the penetration depth and the distribution of implanted ions in a carrier may depend on the stopping mechanism (the interaction of the ions with the solid state material) and may be varied by varying the kinetic energy of the ions. Other parameters, which may be varied, are the dose (or doping material concentration) and the angle between the surface of the solid state material and the propagation direction of the ions during an implantation process. According to various embodiments, after implanting ions a thermal annealing process may be carried out to recover the crystal structure from ion damages. After implanting ions a thermal annealing process may be carried out (e.g. a low temperature annealing to recover the crystal structure but preventing a substantial contribution to the diffusion of the dopant material). According to various embodiments, using a low temperature annealing may provide more confined doped regions in a carrier.

According to various embodiments, the carrier (e.g. a substrate, a wafer, and the like) may be made of semiconductor materials of various types, including silicon, germanium, Group III to V or other types, including polymers, for example, although in another embodiment, other suitable materials can also be used. In an embodiment, the wafer substrate is made of silicon (doped or undoped), in an alternative embodiment, the wafer substrate is a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs).

According to various embodiments, a method for processing a carrier is provided, wherein the method may include: in 110, changing the three-dimensional structure of a mask layer arranged over the carrier so that at least two mask layer regions are formed having different mask layer thicknesses; and, in 120, applying an ion implantation process to the at least two mask layer regions to form at least two implanted regions in the carrier having different implantation depth profiles, as schematically shown in FIG. 1.

Figure 2A:
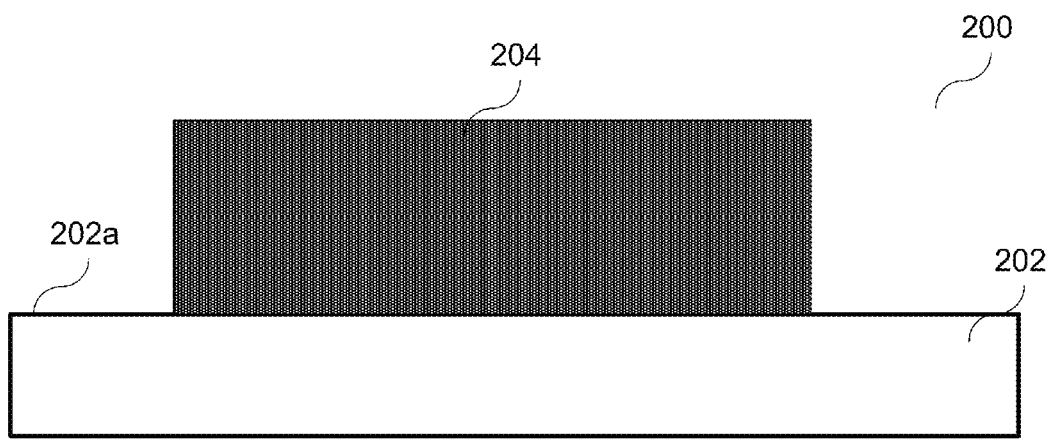
FIG. 2A to FIG. 2C show respectively a cross-sectional view of a carrier at different processing stages of the method for processing a carrier, according to various embodiments.

As shown in FIG. 2A, a mask layer 204 may be arranged over a carrier 202, wherein the mask layer 204 may at least partially cover the carrier 202. According to various embodiments, the mask layer 204 may be generated by a layering process, e.g. by applying at least one of a hard mask material layer and a soft mask material layer. The mask layer 204 may include at least one of the following materials: an organic material, a polymer, a resist, a photoresist, an inorganic material, an oxide layer, a nitride layer, polysilicon, silicon oxide, silicon nitride, and the like.

According to various embodiments, the mask layer 204 may be a homogeneous layer of a single material, e.g. a layer of silicon, a layer of silicon oxide, a layer of silicon nitride, a resist layer including a single photoresist. The thickness 203 of the mask layer 204 may be in a range from about several nanometers up to several micrometers. According to various embodiments, the thickness 203 of the mask layer 204 may depend on the mask material and the kinetic energy of the ions selected for the ion implantation process. According to various embodiments, the thickness 203 of the mask layer 204 may be in the range from about 5 nm to about 20 μm, e.g. in the range from about 5 nm to about 10 μm, e.g. in the range from about 100 nm to about 5 μm if a hard mask material is used, e.g. silicon oxide or silicon nitride, and the thickness 203 of the mask layer 204 may be in the range from about 10 nm to about 10 μm, e.g. in the range from about 50 nm to about 7 μm, e.g. in the range from about 100 nm to about 5 μm if a soft mask material is used, e.g. a resist or a photoresist. According to various embodiments, the mask layer 204 may be a hard mask layer 204 including carbon. According to various embodiments, the mask layer 204 may be a carbon layer.

According to various embodiments, the thickness of the mask layer 204 may be adapted to the energy of the ions, which may be implanted in process 120, as described later. According to various embodiments, the mask layer 204 may have a thickness which may be smaller than the average implantation depth (also referred to as projected range) of the used ions having a specific selected kinetic energy used in process 120, as described later. That means that ions having a respectively selected kinetic energy, e.g. up to several MeV, or a kinetic energy in the range of about 100 keV to about 5 MeV, may penetrate at least in the average through the mask layer 204, according to various embodiments.

According to another embodiment, the mask layer 204 may have a thickness 203, which may be larger than the average implantation depth of the ions having a specific selected kinetic energy used in process 120, as described later. That means that ions having a respectively selected kinetic energy, e.g. a few MeV, or a kinetic energy in the range of about 100 keV to about 5 MeV, may not penetrate at least in the average through the mask layer 204. According to another embodiment, the mask layer 204 may have a much larger thickness than the average implantation depth of the ions having a specific kinetic energy used in process 120, as will be described further below. That means that ions having a respectively selected kinetic energy, e.g. in the range of about 100 keV to about 5 MeV, may not be able to reach the carrier 202.

The carrier 202 may include semiconducting material, as described before. According to various embodiments, the carrier 202 may be a silicon wafer, e.g. a (001)-oriented silicon wafer. According to various embodiments, carrier 202 may include at least a silicon surface layer. According to various embodiments, the carrier may include a base region of an arbitrary material (e.g. including at least one of a metal, an alloy, a membrane, a polymer, a compound material), wherein the base layer is covered with a surface layer including at least one of silicon, epitaxially grown silicon, polysilicon or any other semiconducting material. According to various embodiments, the surface region of the carrier 202 may include silicon, wherein the surface region may have a thickness in the range from about several nanometers to about several micrometers or even larger.

According to various embodiments, applying method 100 may provide a desired doping profile in the carrier 202, which may enable the functionality of an electronic device fabricated at least one of over and in the carrier 202 for example in subsequent processes and/or in processes performed before method 100 is carried out.

It should be noted, according to various embodiments, that the shape of the carrier 202 may not be limiting to the method for processing a carrier, as described herein. According to various embodiments, the carrier may include various structure elements, material layers and the like, as it is desired for the specific design of the electronic device, which is intended to be fabricated using at least method 100 to provide the desired doping profile for the electronic device.

According to various embodiments, the carrier 202 may include at least one of a p-well region and an n-well region (or p-doped region and an n-doped region), and further, the carrier 202 may be a doped carrier or a doped substrate, e.g. at least one of n-doped and p-doped. According to various embodiments, the carrier 202 may include a transistor, e.g. a field effect transistor, e.g. a bipolar transistor. According to various embodiments, the carrier 202 may include at least a part of an integrated circuit or an electronic component of an integrated circuit, e.g. the carrier 202 may include at least a part of a high-voltage device, a sensor, e.g. a hall sensor, e.g. a strain sensor, a diode, an electrostatic discharge protection device, an electrostatic discharge protection diode, and the like, wherein, according to various embodiments, at least a part of the integrated circuit or electronic component may be formed using method 100. According to various embodiments, at least a part of the doped channel regions of the integrated circuit or of the electronic component may be formed using method 100.

Figure 2B:
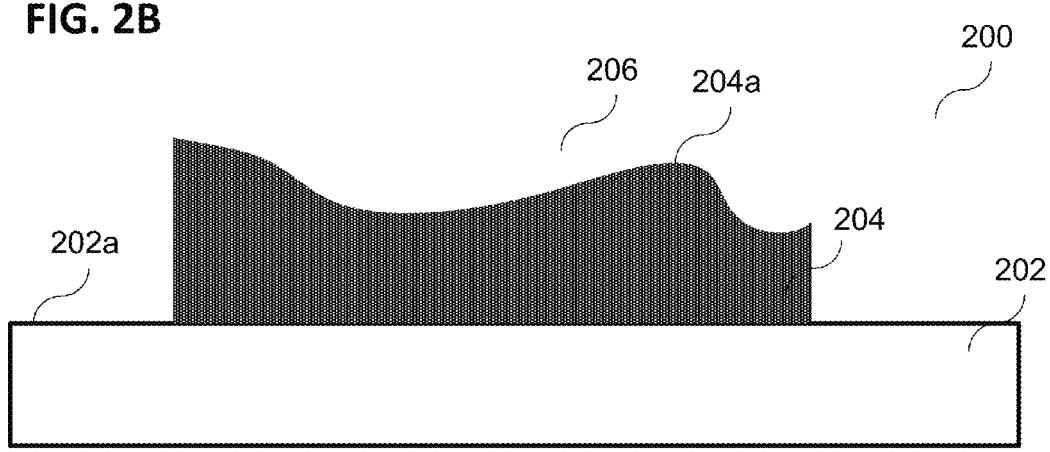

As shown in FIG. 2B, the three-dimensional structure of the mask layer 204 may be changed, according to various embodiments, so that a desired shape is generated after process 110 of method 100 has been carried out. According to various embodiments, the shape 206 of the mask layer 204 may be an arbitrary shape, as schematically illustrated in FIG. 2B, wherein the shape 206 of the mask layer 204 may be equal to the shape of the desired depth profile of the dopant material, which may be implanted into the carrier 202 in process 120. According to various embodiments, the shape 206 of the mask layer 204 may include at least two mask layer regions, or as exemplarily shown in FIG. 2B a plurality of mask layer regions, having different mask layer thicknesses. According to various embodiments, in the limiting case, the mask layer 204 may include an infinite number (for technical reasons in first approximation a large number) of different mask layer thicknesses, wherein the shape may include a continuous smooth shape, which may for example be described using a mathematical expression or equation (e.g. a sine shape, a cosine shape, a shape equal to a superposition of a certain number of sine and cosine functions, or a linear shape).

According to various embodiments, the changing of the three-dimensional structure of the mask layer 204 may be regarded as a patterning of the mask layer 204, and therefore, the mask layer 204 having a changed shape may be referred to herein as patterned mask layer 204.

According to various embodiments, patterning the mask layer 204 may include various different processes, but in general, the used patterning process may not restrict or may not limit the applicability of method 100 as described herein. According to various embodiments, patterning the mask layer 204 (or changing the three-dimensional structure of the mask layer 204) may include at least one of the following processes: a patterning process including a lithographic process and an etch process, an imprinting process, an embossing process, a stamping process, a printing process, ink-jet printing, a hard mask patterning process, a soft mask patterning process, a resist patterning process, and any other process, which may be suitable for changing the three-dimensional structure of a mask layer, e.g. polishing, a laser treatment, a mechanical treatment, a chemical treatment, an etching process and the like.

According to various embodiments, patterning the mask layer 204 (or changing the three-dimensional structure of the mask layer 204) may include gray scale lithography, wherein a single lithographic mask (e.g. a gray scale mask) may be used for exposing different regions of the mask layer 204 with electromagnetic radiation (e.g. light, laser light, ultraviolet light, or X-rays) of different intensity. Accordingly, the mask layer 204 may be a photoresist layer 204 in this case. According to various embodiments, the single lithographic mask (e.g. the gray scale mask) may include regions having different optical transmittances, wherein in the limiting case, the single lithographic mask (e.g. the gray scale mask) may include an infinite number (for technical reasons in first approximation a large number) of lithographic mask regions having different optical transmittances so that a so called gray scale pattern may be provided on the lithographic mask. The gray scale pattern may be provided so that the desired exposure pattern for the mask layer 204 may be transferred from the gray scale mask to the mask layer 204, e.g. by exposing the mask layer 204, as described before, using the gray scale mask. Subsequently, according to various embodiments, the exposed mask layer 204 (or resist layer 204) may be developed generating the shape 206 of the mask layer 204, as shown in FIG. 2B.

According to various embodiments, the single lithographic mask may include at least partially a lithographic pixel mask, wherein the single lithographic mask may include at least two different pixel mask regions to expose the at least two different mask layer regions with different exposures. According to various embodiments, exposing the mask layer 204 (or resist layer 204) to create a complex patterned mask layer 204 (or resist layer 204), may include a complex gray scale pattern including a specific arrangement of pixel, such that the pixel density of each pixel mask region may provide the specific optical transmittance to expose the corresponding region of the mask layer 204 (or resist layer 204) with the desired amount of light (or with a specific energy amount).

According to various embodiments, a pixel mask may include a plurality of small regions (so called pixel), wherein the optical transmittance of a small region (pixel) may be changed by covering the small region with a material preventing the penetration of light through this small region. According to various embodiments, the lithographic mask may be a glass carrier, wherein the optical transmittance is changed by a chromium layer, which may cover a pixel or may not cover a pixel, such that a desired gray scale mask may be provided. According to various embodiments, the shape of the pixel (small regions on the lithographic mask) may be a quadratic shape, a rectangular shape, a circular shape, or any other shape, e.g. a polygonal shape, e.g. a hexagonal shape. According to various embodiments, the distance between the two pixel (small regions on the lithographic mask) being covered with a material (e.g. chromium) may be smaller than the wavelength of the used light for the exposure, such that the pixel may change the intensity of the light, which is transmitted through these regions, but that the pixel are not directly imaged on the resist layer, e.g. as small dots.

Figure 2C:
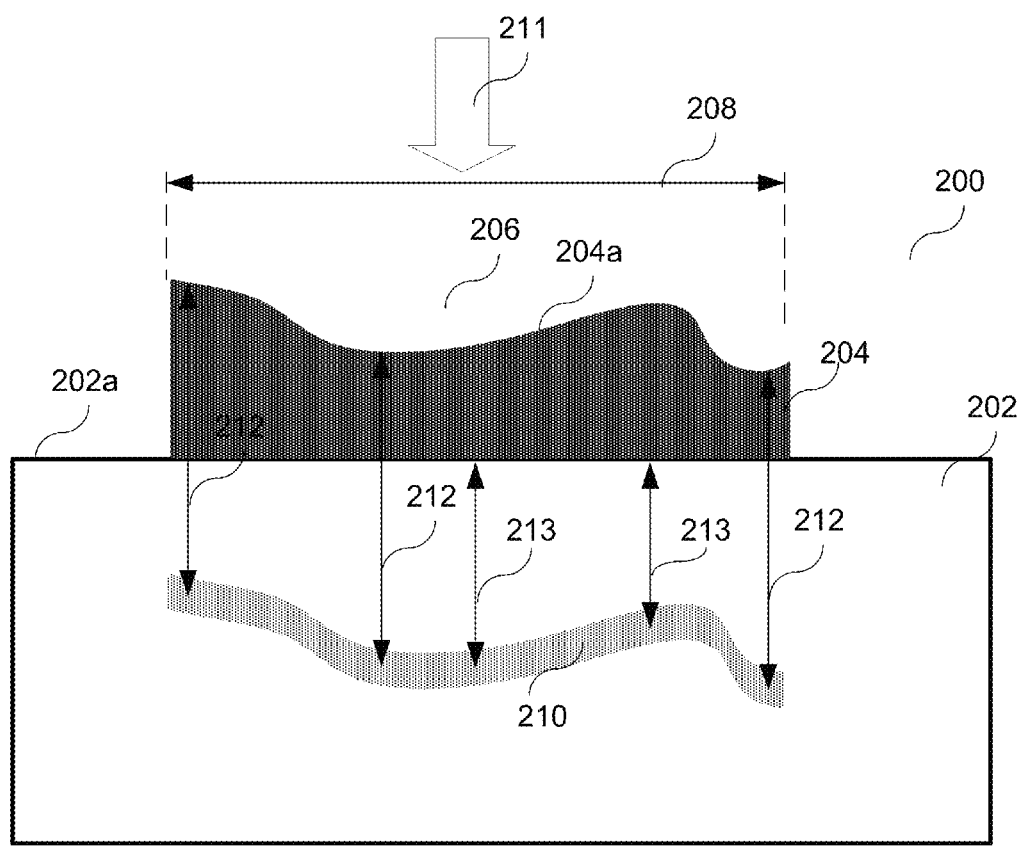

As shown in FIG. 2C, after process 110 of method 100 has been carried out, an implantation process 120 may be performed in a region 208, wherein the region 208 may at least partially include the patterned mask layer 204, to form at least one implanted region 210 in the carrier 202 having an implantation depth profile, which include different implantation depths 213. According to various embodiments, the projected range 212 of the implanted ions through the mask layer 204 and a part of the carrier 202 may be substantially the same for all ions implanted in the region 208, since all ions, which may be implanted during the ion implantation process, may have substantially the same kinetic energy, e.g. an energy in the range from about 5 MeV.

It should be noted, that the projected range 212 may be regarded as the distance of the average of the implanted ions to the upper surface 204a of the patterned mask layer 204, in other words projected range 212 may be the penetration depth of the ions in a solid state material, e.g. in the material of the mask layer 204 and the material of the carrier 202. Further, the implantation depth 213 may be the distance between the average of the implanted ions and the upper surface 202a of the carrier 202. Therefore, according to various embodiments, the implantation depth 213, which may be important for the functionality of an electronic device including at least partially the implanted region 210, may be controlled by the thickness and the shape of the patterned mask layer 204.

According to various embodiments, the complexity of forming a desired doping profile 210, e.g. having a doped region including different implantation depths 213, may include the complexity of forming a patterned mask layer 204 having the respective shape 206. According to various embodiments, the mask layer 204 may be patterned using gray scale lithography, as described before and as described in more detail later on. According to various embodiments, the patterned mask layer 204 may have a smooth surface, e.g. using multiple exposures during the lithographic process including at least one gray scale mask. According to various embodiments, the patterned mask layer 204 may have a step-wise surface morphology, e.g. using a lithographic process including at least one gray scale mask.

According to various embodiments, various possible modifications and details of performing method 100 are shown and described in the following. The following embodiments may include or partially include the features, materials, functionalities and processes as described before.

Figure 3A:
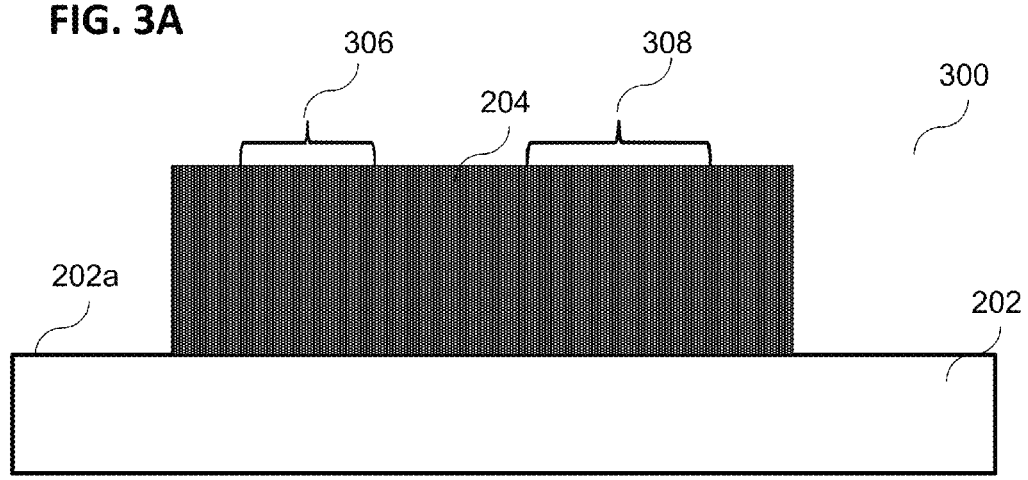
FIG. 3A to FIG. 3C show respectively a cross-sectional view of a carrier at different processing stages of the method for processing a carrier, according to various embodiments.

As shown in FIG. 3A, a resist layer 204 may be arranged (or may be provided) over a carrier 202 as described before referring to FIG. 2A. According to various embodiments, changing the three-dimensional structure of the photoresist layer 204 may include at least one lithographic process, wherein at least two mask layer regions 306, 308 may be exposed to light (e.g. visible light, ultraviolet light, or light with a shorter wavelength than ultraviolet light, e.g. X-rays) using a lithographic process, wherein different exposures may be used for each of the two mask layer regions 306, 308. Therefore, according to various embodiments, at least two mask layer regions 306, 308 may be formed having different mask layer thicknesses 305a, 305b, after the patterning has been carried out including the described lithographic process.

According to various embodiments, the three-dimensional structure of the resist layer 204 may be changed using a single lithographic mask, which may reduce overlay errors, since no further alignment of the lithographic mask is necessary. According to various embodiments, a first region 306 and a second region 308 may be exposed during the lithographic process using a single lithographic mask (e.g. a gray scale mask), wherein the first region 306 may be exposed with light having a first intensity and the second region 308 may be exposed with light having a second intensity, wherein for example the exposure duration may be the same for both regions. The energy amount introduced in the first region 306, which may be exposed with light having a first intensity, may be different from the energy amount introduced in the second region 308, which may be exposed with light having a second intensity. According to various embodiments, the first intensity may be smaller or larger than the second intensity. According to various embodiments, referring to FIG. 3B, the first intensity of the light exposing region 306 may be smaller than the second intensity of the light exposing region 308 (the resist layer may be for example a positive photoresist). According to various embodiments, the first region 306 and the second region 308 may be exposed during the lithographic process using at least one lithographic mask (e.g. at least a gray scale mask), wherein the first region 306 may be exposed with light for a first exposure duration and the second region 308 may be exposed with light for a second exposure duration, wherein for example the intensity of the light may be the same for both regions 306, 308.

According to various embodiments, the energy amount introduced in the first region 306, which may be exposed with light for a first exposure duration, may be different from the energy amount introduced in the second region 308, which may be exposed with light for a second exposure duration. According to various embodiments, the first exposure duration may be smaller or larger than the second exposure duration. According to various embodiments, referring to FIG. 3B, the first exposure duration for exposing region 306 may be smaller than the second exposure duration for exposing region 308.

According to various embodiments, changing the thickness of the mask layer 204 may include introducing different energy amounts into at least two regions of the mask layer 204, such that at least two mask layer regions 306, 308 may be formed having different mask layer thicknesses 305a, 305b.

Figure 3B:
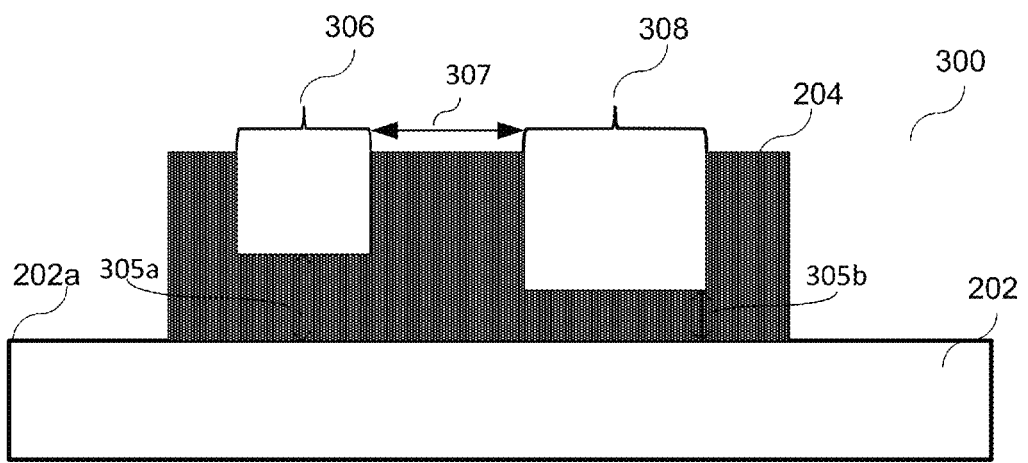

As shown in FIG. 3B, a patterned resist layer 204 may include a first region 306 having a first mask layer thickness 305a (or resist layer thickness 305a) and at least a second region 308 having a second mask layer thickness 305b (or resist layer thickness 305b). According to various embodiments, the first region 306 and the second region 308 may be formed using a single lithographic process, e.g. including a single exposure shot, wherein both regions are exposed at the very same time.

According to various embodiments, if the distance 307 between the first region 306 and the second region 308 may be crucial, e.g. for an electronic device having a size in the range of the minimal feature size of a semiconductor fabrication process, a single exposure of both regions at the very same time, e.g. using a gray scale mask, may reduce overlay errors. According to various embodiments, the number of necessary process steps to generate the patterned mask layer 204 or resist layer 204 may be reduced, if the exposure may be carried out using a gray scale mask.

Figure 3C:
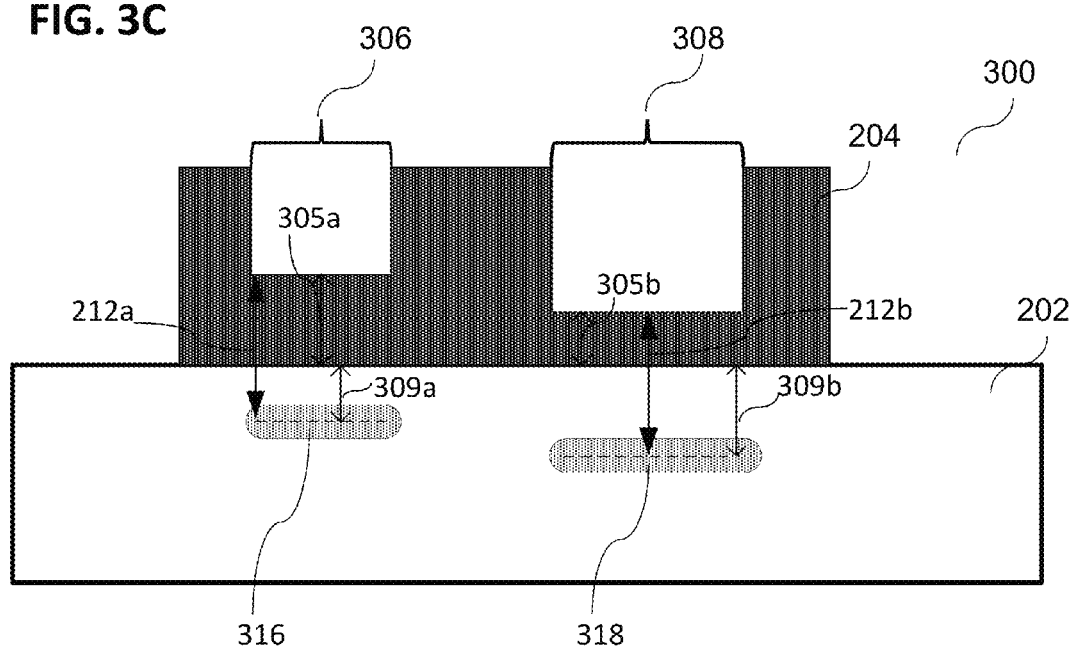

As shown in FIG. 3C, an ion implantation process may be applied to the at least two mask layer regions 306, 308 to form at least two implanted regions 316, 318 in the carrier 202 having different implantation depths 309a, 309b. According to various embodiments, the projected range 212a of ions implanted in the first region 306 may be the same as the projected range 212b of ions implanted in the second region 308. According to various embodiments, the implantation depth 309a of ions being implanted through the first region 306 may be the smaller than the implantation depth 309b of ions being implanted through the second region 308.

According to various embodiments, the implantation depth of the ions implanted in region 316 may be defined by the projected range 212 of the ions, wherein the projected range may depend on the kinetic energy of the ions, the atomic mass of the ions, and the thickness 305a of the mask layer 204. According to various embodiments, the implantation depth of the ions implanted in region 318 may be defined by the projected range 212 of the ions (e.g. depending on the kinetic energy of the ions, e.g. depending on the atomic mass of the ions, and e.g. depending on the thickness 305b of the mask layer 204.

According to various embodiments, the doping profile may be generated without a substantial diffusion process, e.g. without an annealing process at high temperatures for a longer duration. According to various embodiments, an annealing process may be performed to achieve a recrystallization of the carrier material or an activation of the dopant in the doped regions 314, 316 using an anneal temperature in the range from about 500° C. to about 1100° C., wherein the thermal budget, e.g. the energy input into the carrier, may be small, since the duration of the annealing process may be short. Therefore, according to various embodiments, the annealing process may be performed for several seconds (e.g. for 5 s to 20 s) at a temperature of about 1000° C. or for about one second at a temperature of about 1100° C. Regarding to this, a substantial contribution of diffusion processes may require an annealing for several hours at about 1000° C. or for several minutes at about 1200° C. According to various embodiments, recrystallization of the carrier material may be necessary for high implant doses. According to various embodiments, for low implant doses the activation of the dopant material may be sufficient to generate the desired doped regions. According to various embodiments, a short and hot annealing process may have the same thermal budget as a longer annealing process at lower temperatures. According to various embodiments, a short and hot annealing process (e.g. for about one second at a temperature of about 1100° C.), as described before, may provide an optimal annealing to cure implantation damages with a minimal contribution of diffusion processes.

According to various embodiments, more than one ion implantation process may be carried out using the patterned mask layer 204, such that more than one doped region 316, 318 may be formed. According to various embodiments, the implantation depths and the shape of the doped regions 316, 318 in the carrier 202 may be formed according to the desired specifications resulting from the design of a respective electronic device.

Figure 3D:
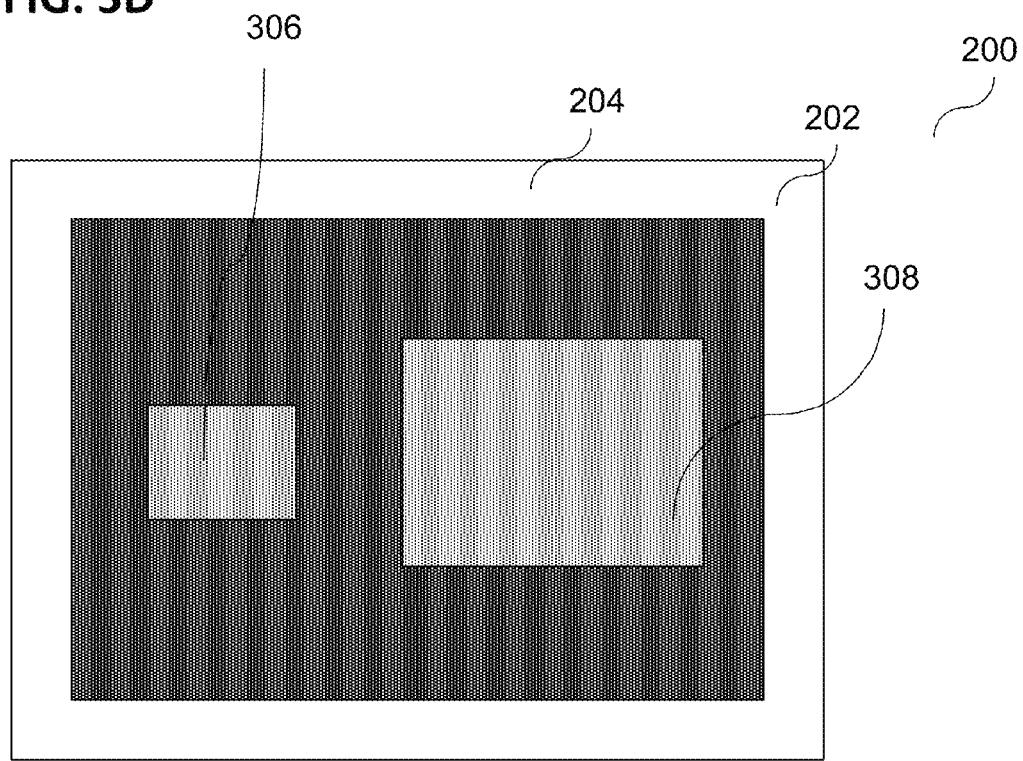
FIG. 3D shows a top view of carrier, after the method for processing a carrier has been carried out, according to various embodiments.
Figure 3E:
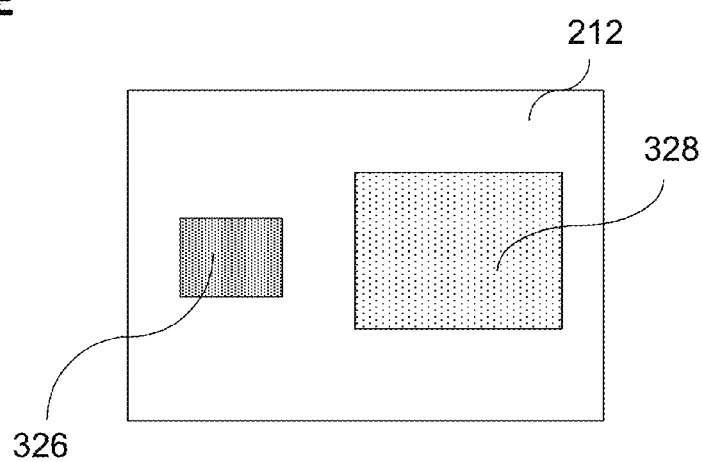
FIG. 3E shows a top view of a lithographic mask, which may be used in the method for processing a carrier, according to various embodiments.

FIG. 3D shows a top view of carrier 202 after the method 100 for processing a carrier has been carried out, according to various embodiments and FIG. 3E shows the corresponding lithographic mask (e.g. a gray scale mask), which may be used to generate the patterned mask layer as described referring to FIG. 3B to FIG. 3D. According to various embodiments, a single lithographic mask 300 may be utilized for exposing the two mask layer regions with different exposures for each of the two mask layer regions 326, 328, such that two resist layer regions 306, 308 may be formed in the resist layer 204, after process 110 of method 100 has been carried out, e.g. after the lithographic process including the lithographic mask 300 has been carried out.

According to various embodiments, the lithographic mask 300 may include at least two regions 326, 328, wherein the optical transmittance provided by the first lithographic mask region 326 is different from the optical transmittance provided by the second lithographic mask region 328. According to various embodiments, exposing the resist layer 204 using the lithographic mask 300 may generate the patterned mask layer as described referring to FIG. 3B to FIG. 3D, wherein the two resist layer regions 316, 318 may have different resist layer thicknesses 305a, 305b. According to various embodiments, an ion implantation process 120 may be carried out to generate the two doped regions 316, 318 in the carrier 202 having two different implantation depths 309a, 309b.

According to various embodiments, the lithographic mask 300 may be a pixel mask, wherein a lithographic mask pattern, e.g. including the first lithographic mask region 326 and the second lithographic mask region 328, may be provided by a pixel arrangement. According to various embodiments, the first lithographic mask region 326 may include a pixel arrangement having a first pixel density and the second lithographic mask region 328 may include a pixel arrangement having a second pixel density. According to various embodiments, the pixel arrangement 326 having the first pixel density may define the intensity of the light for exposing the first resist layer region 306, wherein the same mask may include the pixel arrangement 328 having the second pixel density, which may define the intensity of the light for exposing the second resist layer region 308. The pixel arrangement 326 may have a larger pixel density than the pixel arrangement 328, and therefore, the intensity of the light, which is transmitted through the pixel arrangement 326, may be smaller than the intensity of the light being transmitted through the pixel arrangement 328. Therefore, as already described, the first doped region 316 may have a smaller implantation depth 309a than the second doped region 309b, since the resist layer thickness 305a, after process 110 has been carried out accordingly, may be larger than the resist layer thickness 305b, due to the different exposure, as already described.

According to various embodiments, in analogy, the lithographic mask may include a plurality of regions having different optical transmittances, to generate a plurality of resist layer regions in the resist layer 204 having different resist layer thicknesses, such that an ion implantation process may be carried out to generate a plurality of doped regions in the carrier 202 having different implantation depths.

According to various embodiments, the ion implantation process may be carried out, such that the ions may be implanted simultaneously through the mask layer regions 306, 308 (or resist layer regions 306, 308) to simultaneously form the implanted regions 316, 318 having different implantation depths 309a, 309b in the carrier 202.

According to various embodiments, the ion implantation process may be carried out, such that the ions may be implanted simultaneously through the patterned mask layer 204 (or the patterned resist layer 204) to simultaneously form the implanted regions or a plurality of implanted regions in the carrier 202 having different implantation depths. According to various embodiments, an implanted region may include carrier material and dopant material, which may be introduced into the carrier by ion implantation. According to various embodiments, an implanted region may have a doping profile, e.g. parallel to the implantation direction (e.g. perpendicular or substantially perpendicular to the carrier surface 202a, cf. implantation direction 211 as shown in FIG. 2C), which may be characteristic for ion implantation process of the specific implantation material with a specific implantation energy. In general, the doped material may be diffused after the implantation process, such that for example a desired doping profile may be generated. According to various embodiments, using method 100 as described herein may allow generating a desired doping profile, e.g. having various implantation depths, without using a diffusion process to arrange the dopant material in the carrier 202. Therefore, according to various embodiments, the doping profile using method 100 may differ from a doping profile including thermal diffusion of the dopant material, e.g. the doping profile generated using method 100 may be roughly Gaussian like (that means the depth profile of the dopant concentration may have the shape of a Gaussian distribution, also referred to as normal distribution).

According to various embodiments, the ion implantation process may include ions having a kinetic energy in the range from about 50 keV to about 10 MeV, e.g. in the range of about 300 keV to about 5 MeV, wherein the distribution of the dopant material in the carrier 202 may be characteristic, due to the stopping processes (e.g. electronic stopping and nuclear stopping) of the ions in the carrier material, wherein the ions lose their energy.

According to various embodiments, the implantation of the ions in a certain region of the carrier 202 may be directly connected to the mask layer thickness above the certain region of the carrier 202, as for example the implantation depth equals the projected range of the ions minus the mask layer thickness of the mask layer region influencing the ion implantation.

According to various embodiments, the resist layer 204 may be patterned using at least one of gray scale lithography and maskless gray scale lithography, wherein a gray scale mask may include at least one mask region, which may be configured to reduce the intensity of light being transmitted through this mask region (e.g. to a transmission value between 0% and 100%). According to various embodiments, a gray scale mask may include a plurality of regions which may reduce the intensity of light being transmitted through the respective mask region. According to various embodiments, the optical transmittance of a mask region may increase or decrease step-wise along a certain direction of the mask surface, including for example 20 different regions having different optical transmittances. According to various embodiments, the optical transmittance of at least one mask region may substantially continuously increase or decrease along a certain direction of the mask surface including substantially a linear dependence of the optical transmittance along this direction of the mask surface. According to various embodiments, the optical transmittance of a mask region may decrease due to the alignment of small metallic dots on the mask surface, wherein the size of the dot may be smaller than the respective wavelength of the used light for the exposure, and the specific value of the optical transmittance of the mask region may be defined by the spatial density (e.g. the ratio of the covered and the uncovered mask surface area in the mask region) of the dots in the mask region.

Figure 4A:
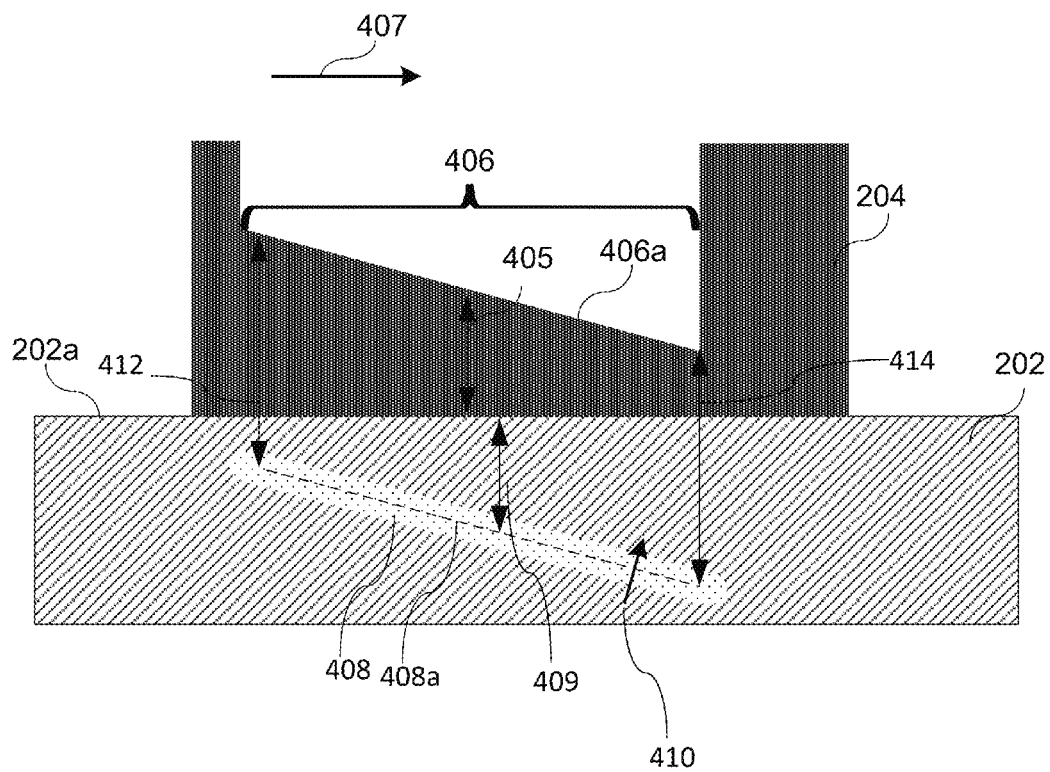
FIG. 4A shows a cross-sectional view of a carrier after method 100 has been carried out, according to various embodiments.
Figure 4B:
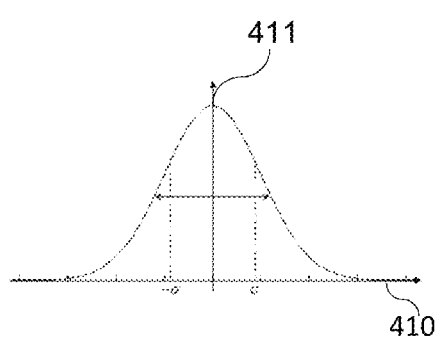
FIG. 4B shows a doping concentration profile of a doped region in a carrier, after the method for processing a carrier has been carried out, according to various embodiments.

FIG. 4A shows a cross-sectional view of a carrier after method 100 has been carried out, according to various embodiments. As shown in FIG. 4A, according to various embodiments, the patterned mask layer 204 may include a mask layer region 406 having a decreasing mask layer thickness 405 along a direction 407 parallel to the surface of the carrier 202. Therefore, according to various embodiments, the doped region 408, which may be implanted through the mask layer region 406, may have an increasing implantation depth 409 along the direction 407 parallel to the surface of the carrier 202. According to various embodiments, the doping profile, e.g. the spatial doping concentration distribution, along the direction 410 may be Gaussian like, as shown in FIG. 4B, or at least partially Gaussian like, e.g. approximately Gaussian like. According to various embodiments, the distance from a region having the maximal doping concentration 411 (e.g. the part of the doped region 508 having the maximal doping concentration is illustrated by the dotted line 408a) to the surface 202a of the carrier 202 may be regarded as the implantation depth 409, wherein the distance between a region having the maximal doping concentration 411 and the surface 406a of the mask layer region 406 may be regarded as the projected range. According to various embodiments, the projected range 412, e.g. of implanted ions in a region having a larger mask layer thickness 405, may be equal to the projected range 414, e.g. of implanted ions in a region having a smaller mask layer thickness 405, as shown in FIG. 4A. According to various embodiments, the projected range 412, e.g. of implanted ions in a region having a larger mask layer thickness 405, may be smaller than the projected range 414, e.g. of implanted ions in a region having a smaller mask layer thickness 405, not shown in figures, as for example if the energy loss of the ions in the mask layer material is larger than the energy loss of the ions in the carrier material. According to various embodiments, the projected range 412, e.g. of implanted ions in a region having a larger mask layer thickness 405, may be larger than the projected range 414, e.g. of implanted ions in a region having a smaller mask layer thickness 405, not shown in figures, as for example if the energy loss of the ions in the mask layer material is smaller than the energy loss of the ions in the carrier material.

Figure 5:
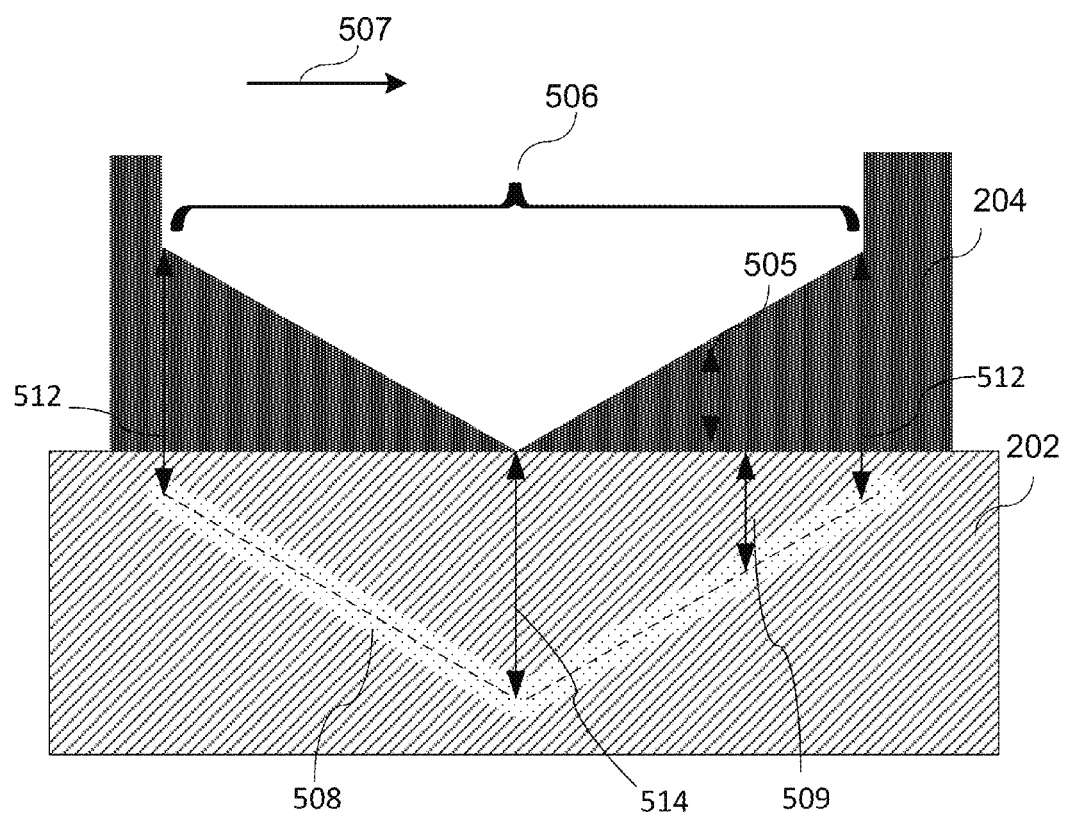
FIG. 5 shows a cross-sectional view of a carrier, after method 100 has been carried out, according to various embodiments.

FIG. 5 shows a cross-sectional view of a carrier after method 100 has been carried out, according to various embodiments. As shown in FIG. 5, according to various embodiments, the patterned mask layer 204 may include a mask layer region 506 having a decreasing mask layer thickness 505 along a direction 507 parallel to the surface of the carrier 202 in a first part of the mask layer region 506, in analogy to FIG. 4A, and an increasing mask layer thickness 505 along the direction 507 in a second part of the mask layer region 506. Therefore, according to various embodiments, the doped region 508, which may be implanted through the mask layer region 506 may have an increasing implantation depth 509 along the direction 507 parallel to the surface of the carrier 202 in a first part of the doped region 508, in analogy to FIG. 4A, and a decreasing implantation depth 509 along the direction 507 in a second part of the doped region 508. According to various embodiments, a decreasing implantation depth means that the ions penetrated deeper into the substrate 202. According to various embodiments, using method 100, as described herein, may enable the fabrication of a V-shape doped region, as shown in FIG. 5. According to various embodiments, the projected range 512, e.g. the projected range of implanted ions in a region having a larger mask layer thickness 505, may be equal to the projected range 514, e.g. of implanted ions in a region having a smaller mask layer thickness 505, as shown in FIG. 5. According to various embodiments, the projected range 512 may be smaller or larger than the projected range 514, as described referring to FIG. 4A.

According to various embodiments, a doped region (e.g. doped regions 210, 316, 318, 408, 508) in a carrier 202 may be at least partially included in an electronic device, such as for example in a transistor, an integrated circuit, a memory cell, an optical sensor, a hall sensor, a vertical hall sensor, a magnetic field sensor, an electrostatic discharge protection device, a high voltage transistor, a field effect transistor, a high voltage field effect transistor, and the like.

According to various embodiments, the mask layer 204 may be a resist layer 204. According to various embodiments, the resist layer 204 may be formed by using at least one layering process for depositing the resist material, e.g. a photoresist, at least partially over the carrier 202, and at least a patterning process, such that a patterned resist layer 204 is formed. According to various embodiments, the patterned resist layer 204 may provide the same functionality as described herein for the mask layer 204. According to various embodiments, the resist layer may be applied by spin coating or spray coating, as described above. According to another embodiment, the mask layer 204 may be a hard mask layer. According to various embodiments, the hard mask layer 204 may be formed by using at least one layering process for depositing the hard mask material at least partially over the carrier 202, and at least a patterning process, such that a patterned hard mask layer 204 is formed. According to various embodiments, the patterned hard mask layer may provide the same functionality as described herein for the mask layer 204 or the resist layer 204. According to various embodiments, the hard mask layer may be provided by patterning using gray scale lithography.

Figure 6A:
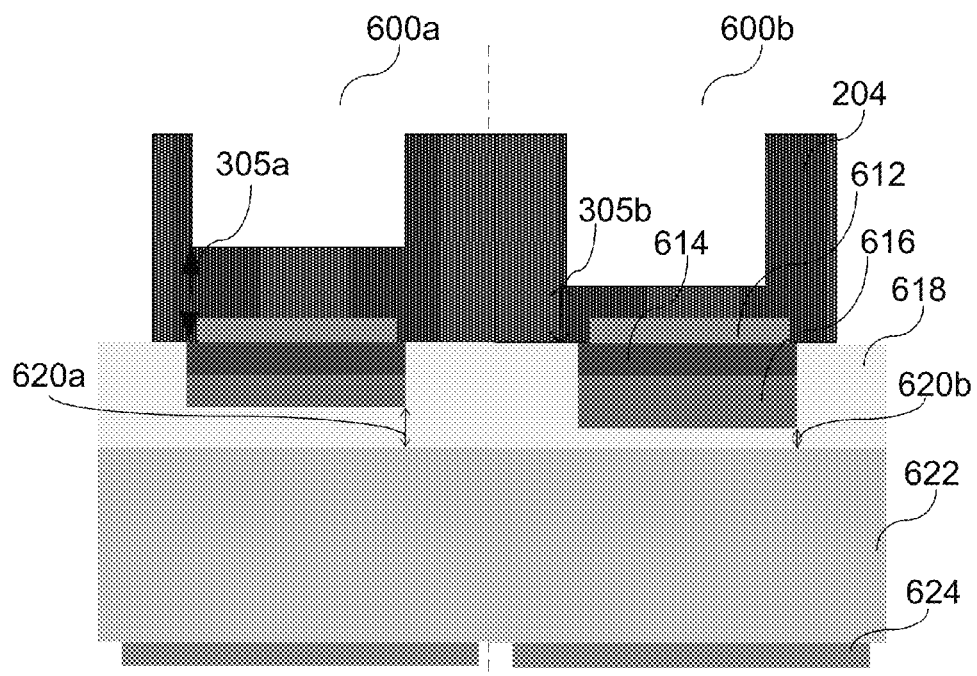
FIGS. 6A and 6B respectively show a cross-sectional view of an electronic device including various doped regions having different implantations depths, according to various embodiments.

FIG. 6A shows a cross-sectional view of an electrostatic discharge device 600a, 600b including at least two doped regions 616a, 616b (e.g. p-type doped regions) having different implantations depths, according to various embodiments. According to various embodiments, the electrostatic discharge device 600a, 600b (e.g. an electrostatic discharge protections device) may include respectively a first electrode 612 (e.g. an anode), an epitaxially grown doped layer 618 (e.g. a p-type doped silicon layer), a doped substrate 622 (e.g. an n-type doped silicon substrate), a second electrode 622 (e.g. a cathode). According to various embodiments, the electrostatic discharge device 600a, 600b may include further doped regions 614, e.g. a further p-type doped region.

According to various embodiments, due to the different implantations depths of two doped regions 616a, 616b the distance 620a between the first doped region 616a and the upper surface of the doped substrate 622 may be different (e.g. larger) from the distance 620b between the second doped region 616b and the upper surface of the doped substrate 622. According to various embodiments, the breakdown voltage of the electrostatic discharge device 600a, 600b (e.g. of a diode 600a, 600b) may depend on the distance 620a, 620b between the doped regions 616a, 616b and the doped substrate 622. The doped regions 616a, 616b may be formed by using method 100 as described herein, e.g. including gray scale lithography. The resist layer 204 may be provided as described before e.g. referring to FIG. 3A and FIG. 3B. Therefore, the two doped regions 616a, 616b having different implantations depths may be formed using only one lithographic process, e.g. a single exposure shot using a gray scale mask. Therefore, an electrostatic discharge device 600a, 600b may be formed including the use of method 100, as described herein, having different breakdown voltages while using only one patterned resist layer 204. According to various embodiments, a carrier 202 may include a plurality of electrostatic discharge device structures having a plurality of different implantation depths, wherein the plurality of doped regions having different implantations depths may be formed using only one lithographic process, e.g. a single exposure shot using a gray scale mask and an ion implantation process subsequently.

According to various embodiments, a plurality of electrostatic discharge devices having a plurality of breakdown voltages may be fabricated using a single lithographic process for changing the three-dimensional structure of the mask layer 204 arranged over the surface of the substrate 622, wherein the implanted regions (also referred to as doped regions) 616a, 616b may be formed by applying an ion implantation using the patterned mask layer 204 as implantation mask.

Figure 6B:
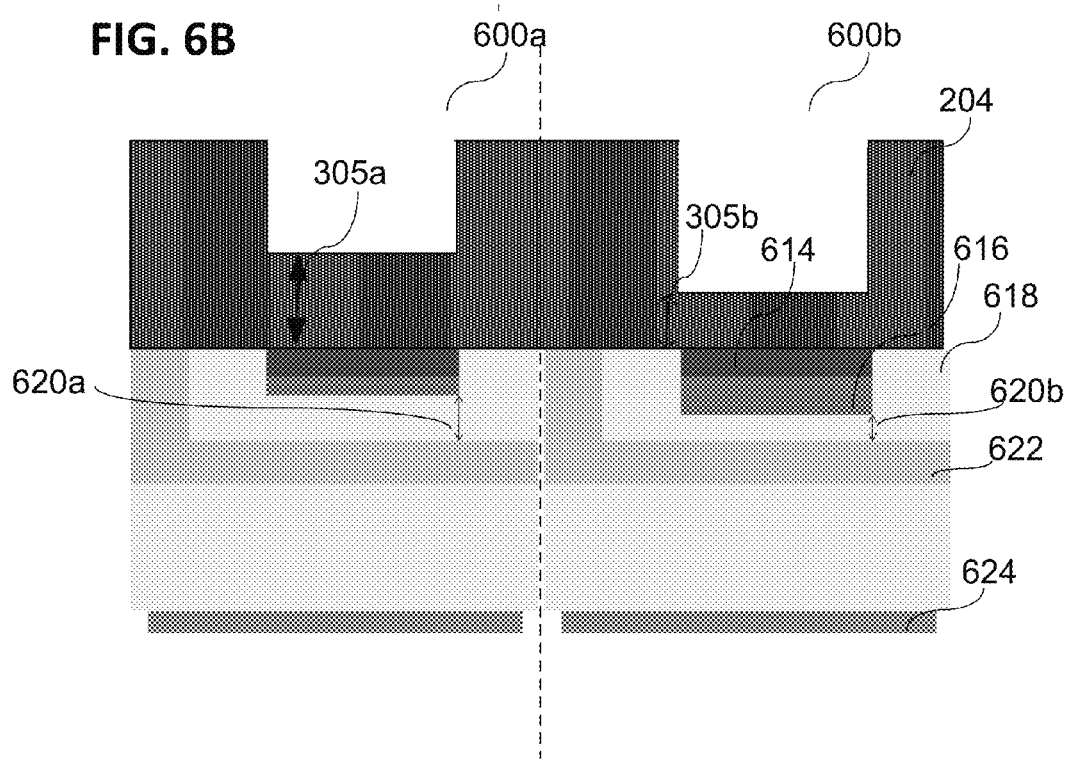

FIG. 6B shows a cross-sectional view of an electrostatic discharge device 601a, 601b, in analogy to the electrostatic discharge device 600a, 600b shown in FIG. 6A, having a different design but the same functionality as already described referring to FIG. 6A. According to various embodiments, the electrostatic discharge device 601a, 601b may include at least two doped regions 616a, 616b (e.g. p-type doped regions) having different implantations depths, according to various embodiments. According to various embodiments, the electrostatic discharge device 601a, 601b (e.g. an electrostatic discharge protections device) may include respectively a first electrode (e.g. an anode) arranged above the doped region 614, a doped substrate 626 (e.g. a p-type doped silicon substrate), a second electrode 624 (e.g. a substrate electrode) and a doped substrate region 622 (e.g. a high n-type doped region electrically connected to a cathode). According to various embodiments, the electrostatic discharge device 601a, 601b may be fabricated using at least method 100, as described herein. According to various embodiments, fabrication the electrostatic discharge device 600a, 600b, 601a, 601b may further include at least one of a layering process, a patterning process, a metallization process and the like for forming the components of the device, wherein at least the implanted regions 616a, 616b may be formed using method 100, as described herein.

Figure 6C:
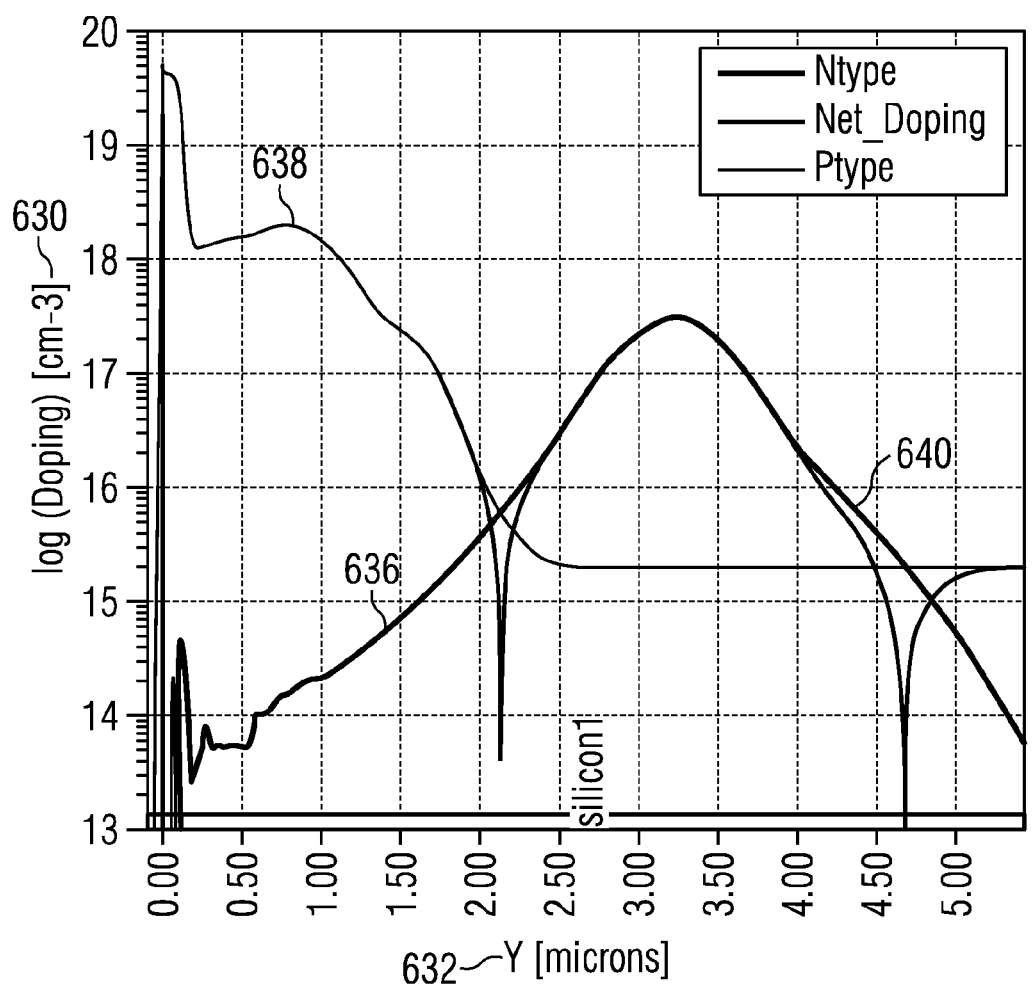
FIG. 6C shows a doping profile, according to various embodiments.

FIG. 6C shows a doping profile of an implanted region of a carrier 202, according to various embodiments. According to various embodiments, the doping profile may illustrate the doping concentration 630 depending on the distance (depth) from the surface of the carrier 202. According to various embodiments, the doping profile may show the doping profile of the electrostatic discharge devices 600a, 600b, 601a, 601b as shown in FIG. 6A and FIG. 6B. According to various embodiments, the doping profile shows the p-type doping concentration profile 638, the n-type doping concentration profile 636, and the resulting net doping concentration profile 640 resulting from the doping process included in method 100. According to various embodiments, the doping profile may not include contributions of thermal diffusion of the dopant material in the carrier.

Figure 7A:
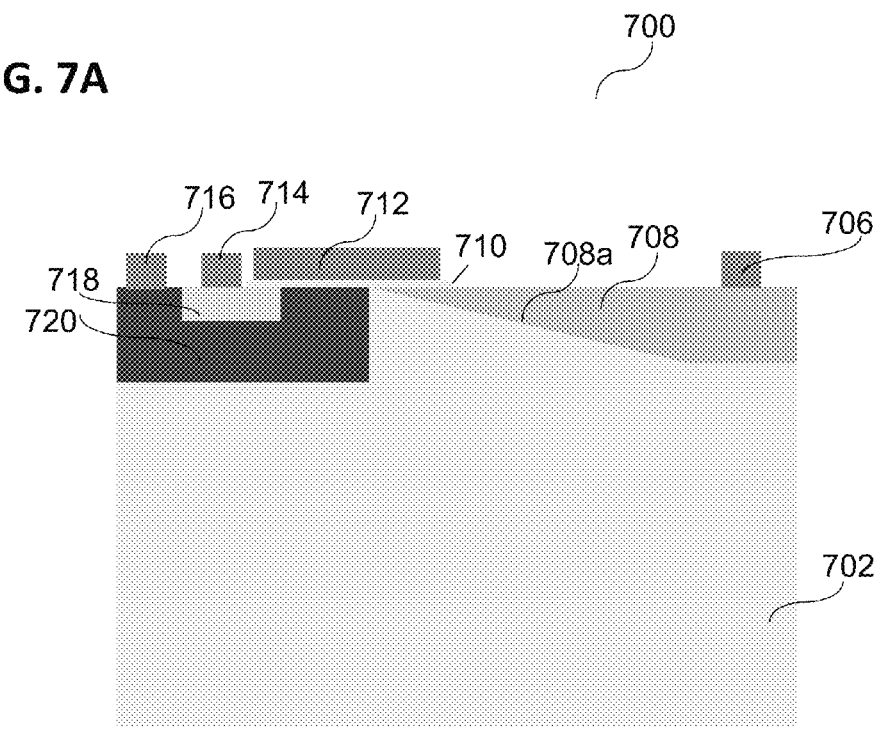
FIG. 7A shows a cross-sectional view of a field effect transistor having a drain-extension implantation profile, after method 100 has been carried out, according to various embodiments.

As shown in FIG. 7A, a field effect transistor 700 may include a drain-extension implantation profile 708, according to various embodiments. According to various embodiments, the implantation depth of the implantation region 708 may decrease continuously, in analogy to the doped region 408, as shown in FIG. 4A. According to various embodiments, the field effect transistor 700 may include electrical contacts, e.g. a body contact 716, a source contact 714, a gate contact 712 and a drain contact 706. The field effect transistor 700 may further include a first doped region 718 (e.g. an n-type doped region), a second doped region 720 (e.g. a p-type doped region), an electrically insulating layer 710, and a substrate 702 (e.g. a p-type doped substrate). According to various embodiments, drain-extension implantation profile 708 may be formed by applying method 100, as described similar referring to FIG. 4A; therefore, the drain-extension implantation profile 708 may have the same features and functionalities as described before referring to FIG. 4A.

Figure 7B:
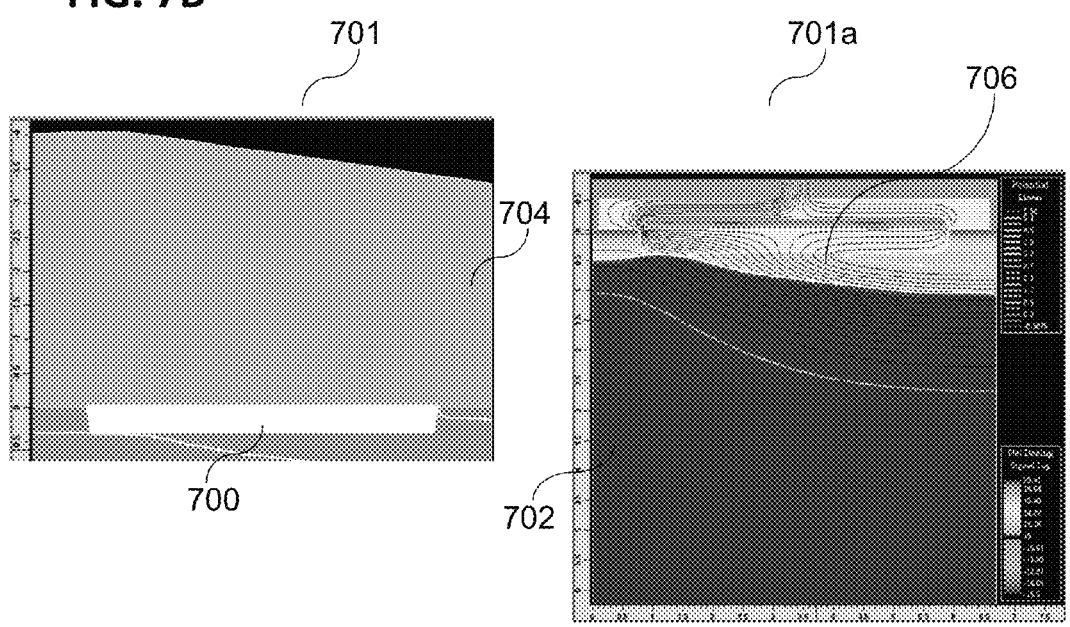
FIG. 7B shows a resist layer profile and a resulting doping profile of a field effect transistor having a drain-extension implantation profile.

FIG. 7B shows a resist layer profile 701 arranged over the electronic device 700 (e.g. the field effect transistor having a drain-extension implantation profile) and a resulting doping profile 701a, which may result after method 100 has been carried out. According to various embodiments, fabricating the field effect transistor 700 having a drain-extension implantation profile 708 may further include at least one of a layering process, a patterning process, a metallization process and the like for forming the components of the device, wherein the implanted region 708 may be formed using gray scale lithography, e.g. as described herein referring to method 100. According to various embodiments, the doping profile 706 of the implanted region 708 may differ from a doping profile including thermal diffusion, e.g. the doping profile 706 of the implanted region 708 may include a Gaussian type of doping profile, or at least an approximately Gaussian type of doping profile. According to various embodiments, the implanted region 708, e.g. having the doping profile 706, may provide an optimal resistance of the channel corresponding to a given breakdown voltage.

According to various embodiments, the doping profile 706 of the drain extension region 708 may differ from a doping profile including thermal diffusion, e.g. the doping profile 706 of the implanted region 708 may include a Gaussian type of doping profile, or at least an approximately Gaussian type of doping profile.

Figure 8A:
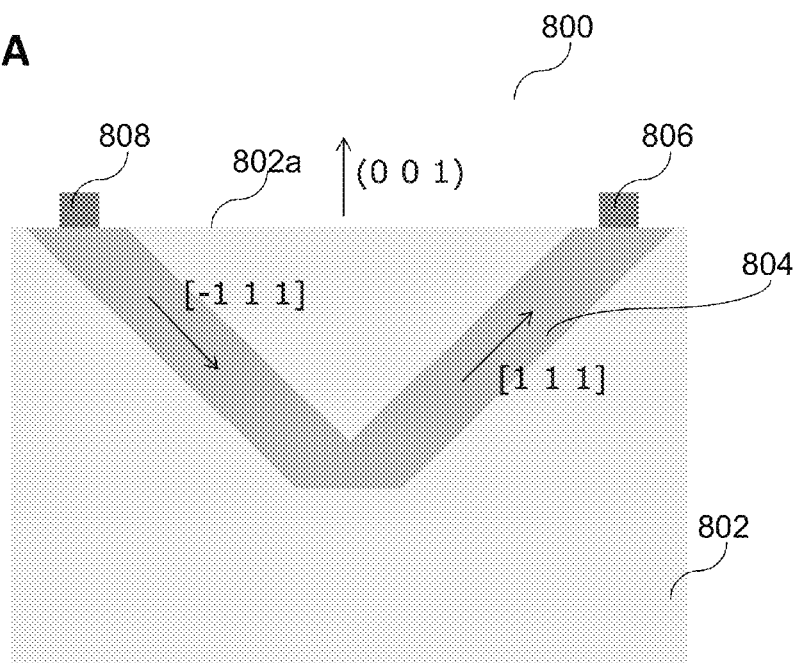
FIG. 8A shows a cross-sectional view of a strain sensor device having a V-shape doped region, after method 100 has been carried out, according to various embodiments.

As shown in FIG. 8A, according to various embodiments, an electronic device 800, e.g. a strain sensor device 800, may be fabricated using at least method 100, e.g. as described herein referring to FIG. 5, wherein fabricating the strain sensor device 800 may also include other semiconductor techniques as for example layering, patterning, and/or a metallization process. According to various embodiments, the strain sensor device 800 may include at least two electrical contacts, e.g. electrical contacts 806, 808, wherein the two electrical contacts 806, 808 may provide a current flow through the implanted region 804. According to various embodiments, the implanted region 804 may have a V-shape (according to the cross-sectional view), wherein the implanted region 804 may be provided using method 100 as for example described referring to FIG. 5. According to various embodiments, the carrier 802 may be a silicon substrate and the implanted region 804 may be a p-type doped region or an n-type doped region. According to various embodiments, the carrier 802 may include any semiconductor material or any combination of materials as described before.

Figure 8B:
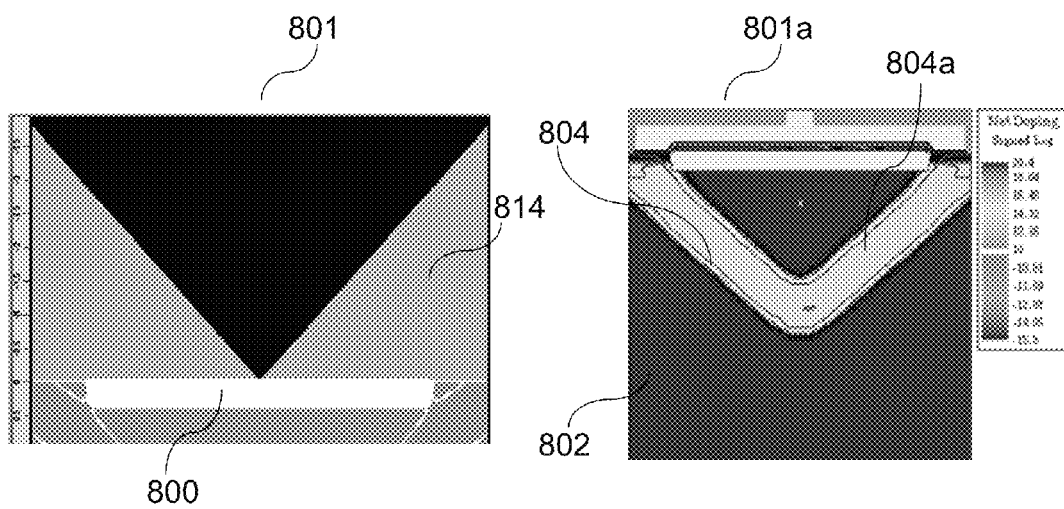
FIG. 8B shows a resist layer profile and a resulting doping profile of a strain sensor device having a V-shape doped region, according to various embodiments.

FIG. 8B shows a resist layer profile 801 and a resulting doping profile 801a after method 100 has been carried out. According to various embodiments, the resist layer 814 may have the same shape as the doping profile 804a of the doped region 804 (or implanted region 804) of the strain sensor device 800 shown in FIG. 8A. According to various embodiments, the mask layer 814 (or resist layer 814) may be patterned e.g. as described referring to process 110 of method 100. According to various embodiments, the mask layer 814 (or resist layer 814) may be patterned using gray scale lithography.

According to various embodiments, the doping profile 801 as shown in FIG. 8B illustrate the equivalent doping concentration lines (the black lines in the doped region 804), which are the parts of the doped region 804 having the same concentration of dopant material. According to various embodiments, the equivalent doping concentration lines shown in the cross-sectional view 801a may represent equivalent doping concentration regions or equivalent doping concentration planes. According to various embodiments, the equivalent doping concentration regions may not run parallel to the surface of the carrier, e.g. the equivalent doping concentration regions may not run parallel to the surface 802a of the carrier 802 including the structure elements forming a strain sensor device 800.

According to various embodiments, the carrier 802 may be a p-type doped substrate, e.g. a p-type doped silicon substrate, and the doped region 804 may be an n-type doped region. According to various embodiments, the current in the strain sensor device 800 may flow from the first electrode 808 to the second electrode 806, wherein the current flows along different crystallographic directions of the carrier 802, wherein the carrier 802 may be a silicon substrate. According to various embodiments, the current in the strain sensor device 800 may flow along the [−1,1,1] and the [1,1,1] directions, or other specific crystallographic directions in the carrier 802. According to various embodiments, the current in the strain sensor device 800 may flow along the equivalent doping concentration regions or lines. According to various embodiments, mechanical stress in the carrier, e.g. induced by strain, may change (or modulate) the electrical resistance of the strain sensor device 800. According to various embodiments, the modulated resistance, and therefore for example the stress or the strain, may be analyzed into directional components. According to various embodiments, method 100, as described herein, may provide a simple, cost effective, and efficient way to realize a strain sensor based on silicon technology, wherein a specific doping profile may be desired. While using method 100 for generating the doping profile 801a, a thermal diffusion of dopant material may not be necessary to form the doped region 804 or the implanted region 804.

Figure 9A:
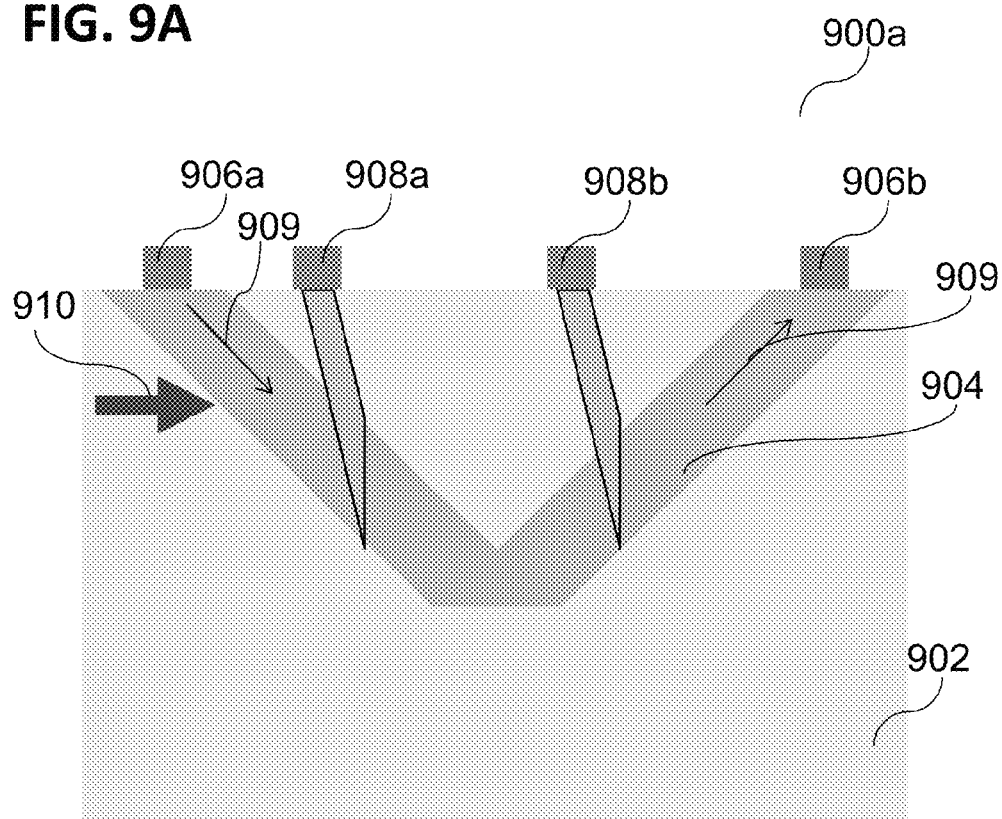
FIG. 9A shows a cross-sectional view of a hall sensor device having a V-shape doped region, after method 100 has been carried out, according to various embodiments.

As shown in FIG. 9A, according to various embodiments, an electronic device 900, e.g. a hall sensor device 900, may be fabricated using at least method 100, e.g. as described herein referring to FIG. 5. According to various embodiments, the hall sensor device 900 may have a V-shape doped region 904 (or implanted region 904), according to the cross-sectional view. The hall sensor device 900 may further include a carrier 902 and implanted contact regions 904a, 904b, 904c, 904d providing an electrical contact for measuring the hall voltage of the V-shape doped region 904. According to various embodiments, an in plane magnetic field 910, e.g. a magnetic field parallel to the surface 902a of the carrier 902, may be detected using the hall sensor device 900. According to various embodiments, a magnetic field 910, e.g. a magnetic field in any direction, may be detected using the hall sensor device 900. According to various embodiments, the hall sensor device 900 may further include electrical contacts 908a, 908b, 908c, 908d being electrically connected to the respective implanted contact region 904a, 904b, 904c, 904d. According to various embodiments, the carrier may have the opposite type of doping according to the implanted contact regions 904a, 904b, 904c, 904d and the V-shape doped region 904. According to various embodiments, the carrier 902 may be a p-type doped substrate and the implanted contact regions 904a, 904b, 904c, 904d and the V-shape doped region 904 may be n-type doped. According to various embodiments, the carrier 902 may be a n-type doped substrate and the implanted contact regions 904a, 904b, 904c, 904d and the V-shape doped region 904 may be p-type doped. According to various embodiments, the carrier 902 may be a p-type doped silicon substrate and the implanted contact regions 904a, 904b, 904c, 904d and the V-shape doped region 904 may be n-type doped. According to various embodiments, the carrier 902 may be a n-type doped silicon substrate and the implanted contact regions 904a, 904b, 904c, 904d and the V-shape doped region 904 may be p-type doped.

Figure 9B:
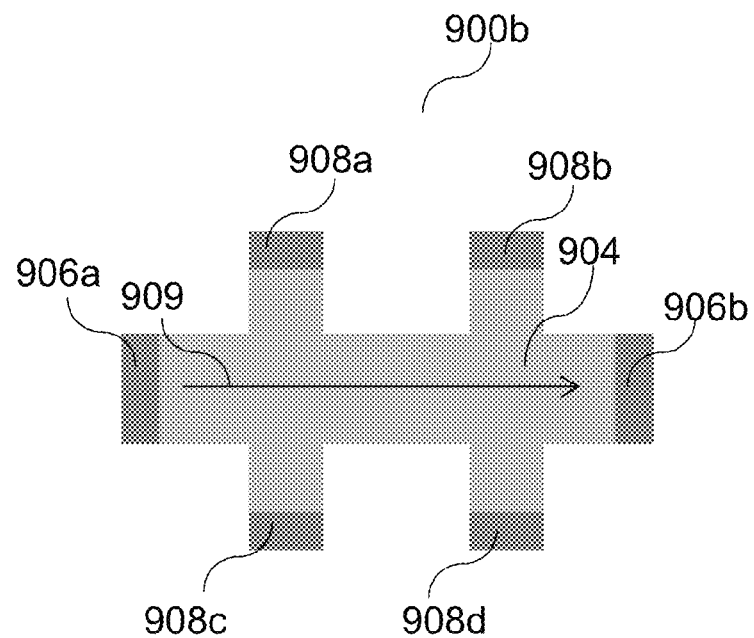
FIG. 9B shows a top view of a hall sensor device having a V-shape doped region, according to various embodiments.

According to various embodiments, the V-shape doped region 904 may have a similar doping profile as shown in FIG. 8B for the strain sensor device 800. According to various embodiments, the implanted contact regions 904a, 904b, 904c, 904d and the V-shape doped region 904 may be generated by using method 100, e.g. by using a single lithographic process and a single implantation process. According to various embodiments, the mask layer for the ion implantation process may be formed using gray scale lithography. According to various embodiments, the mask layer for the ion implantation process may include a first region for implanting the ions forming the V-shape doped region 904, wherein the mask layer may be similar to the mask layer 814 shown in FIG. 8B. According to various embodiments, the mask layer for the ion implantation process may further include at least one additional region to form the implanted contact regions 904a, 904b, 904c, 904d. According to various embodiments, the implanted contact regions 904a, 904b and implanted contact regions 904c, 904d may respectively form a V-shape doped contact region, wherein the V-shape doped contact region may be aligned perpendicular the V-shape doped region 904, as it is illustrated in the top view shown in FIG. 9B. According to various embodiments, the hall sensor device 900 may further include at least two electrical contacts 906a, 906b being electrically connected to the V-shape doped region 904.

According to various embodiments, the electrical current may flow within the V-shape doped region 904 from one electrode 906a, 906b to the other. According to various embodiments, the current may be redirected by the present magnetic field, such that an electrical hall voltage can be measured at the electrical contacts 908a, 908b, 908c, 908d. In general, according to various embodiments, at least two electrical contacts 908a, 908c or 908b, 908d may be necessary, wherein the use of four electrical contacts 908a, 908b, 908c, 908d for measuring the hall voltage may provide more reliable or more precise measurement results. According to various embodiments, a symmetric electrode configuration, or electrical contact configuration, may provide an improved reproducibility for the measurement of the hall voltage.

According to various embodiments, the hall sensor device 900 including the doped region (V-shape) as described referring to FIG. 8A and FIG. 9A may detect a magnetic field in all possible directions, since due to the shape of the doped region 904 (and accordingly the current flow directions 909) the current may not flow parallel to the magnetic field direction, wherein in this case (wherein the current flow is parallel to the magnetic field direction) the hall voltage would be zero.

According to various embodiments, using method 100 may provide a beneficial method for fabrication electronic devices having complex doping profiles, as for example the strain sensor device 800 and the hall sensor device 900. According to various embodiments, the method 100 as described herein may provide a simple, efficient, effective way to form doping profiles include depth gradients, e.g. doping profiles as shown in FIG. 7B and FIG. 8B. According to various embodiments, a complex doping profile may be generated without using thermal diffusion of the dopant material in the carrier.

Figure 10:
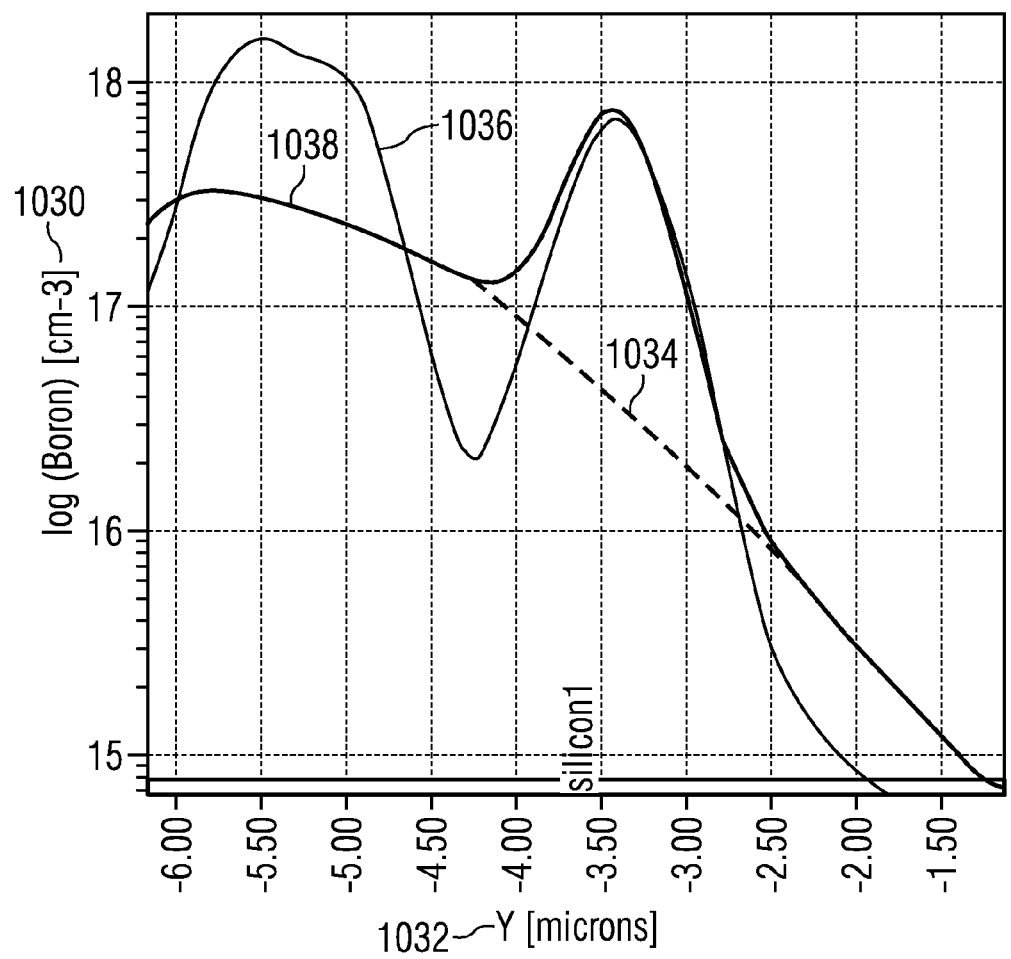
FIG. 10 shows different doping concentration depth profiles including straggling or thermal diffusion, according to various embodiments.

As shown in FIG. 10, a doping concentration depth profile 1038 of an implantation process including thermal diffusion may differ from a doping concentration depth profile 1036 without substantial thermal diffusion 1034 of the dopant material. According to various embodiments, the doping concentration depth profile 1036 may be formed using only a small thermal budget for diffusion. According to various embodiments, using doping processes without substantial thermal diffusion, wherein the straggling may dominate the dopant material distribution, may provide a more confined doped region, which may allow a current flow in the confined doped region such that the current may be guided through the carrier by the specific doping profile, as shown in FIG. 7B, FIG. 8B, and FIG. 9A.

According to various embodiments, the method 100, e.g. as described referring to FIG. 3C, may be used in a similar way to fabricate an electronic device including a plurality of doped regions, e.g. by using a single gray scale lithographic process for changing the three-dimensional structure of the mask layer arranged over the carrier, such that after an ion implantation through the patterned mask layer a plurality of doped regions may be generated having different implantation depths. Therefore, according to various embodiments, this method may be utilized to fabricate an electronic device, e.g. an optical sensor, including doped regions, wherein each of the doped regions may have a different implantation depth. Since the penetration depth of light into a carrier, e.g. into a silicon substrate, may depend on the wavelength of the light, an optical sensor may be fabricated by using method 100, which may be sensitive to selected wavelengths of the detected light. Therefore, according to various embodiments, the depth of the implanted regions in the carrier may be adapted to the respective penetration depth of the light with a specific wavelength. According to various embodiments, method 100 may provide, e.g. as shown in FIG. 3C, a simple, cost effective, and efficient way to fabricate optical sensors including doped regions in various depths below the substrate surface.

According to various embodiments, a photo sensitive device may include a plurality of doped regions, wherein the plurality of doped regions may have different doping profiles and different implantation depths. According to various embodiments, photo sensitive device may include a plurality of doped regions, wherein the plurality of doped regions may have different implantation depths.

According to various embodiments, a photo sensitive device may be an optical sensor or a spectrometer. According to various embodiments, an optical sensor or a spectrometer may be formed by using at least method 100, as described herein.

According to various embodiments, a photo sensitive device may be fabricated using different photoresist thicknesses, to form regions having at least one of different dopant concentrations and different implantation depths.

According to various embodiments, a photo sensitive device may further include an array of photosensitive detectors, e.g. diodes.

According to various embodiments, the method for processing a carrier, as described herein, may reduce the complexity of a manufacturing process for an electronic device, e.g. since the number of ion implantation processes may be reduced. According to various embodiments, reducing the number of implantation processes may increase the process efficiency and reduce processing cost, since implantation processes in general may cause a substantial contribution to the processing costs. According to various embodiments, the method for processing a carrier, as described herein, may reduce the complexity of a manufacturing process and therefore, may reduce problems during manufacturing an electronic device, e.g. may reduce overlay errors.

According to various embodiments, the stopping mechanism (or the energy loss characteristic) of the ions penetrating a solid state material may depend on the mass (rest mass) of the ions.

According to various embodiments, a doping profile, as described herein, may be dominated by straggling of the ions, e.g. in absence of a substantial contribution of diffusion processes, wherein the doping profile, e.g. the depth profile of the doping concentration, may be described by a dual Pearson distribution function.

According to various embodiments, the projected range may depend on the respective stopping mechanism for the ions penetrating a solid state material. According to various embodiments, since the stopping power (or the stopping mechanism) may depend on the specific solid state material, the projected range may depend on the thickness of the mask layer. According to various embodiments, the stopping power of the mask material (or the mask layer) may differ from the stopping power of the carrier material (or the carrier), therefore, the topology (the spatial arrangement) of the doped regions may be similar (and not identical) to the topology of the mask layer.

According to various embodiments, a lithographic mask, e.g. a gray scale mask, as described herein, may include a convolution of a first lithographic mask pattern and a second lithographic mask pattern, wherein the first lithographic mask pattern may be designed for exposing a mask layer, to generate a desired patterned mask layer, and the second lithographic mask pattern may be designed to compensate light intensity variations of an exposure tool, e.g. light intensity variations in an exposure field of the exposure tool.

According to various embodiments, an exposure tool, e.g. an i-line stepper, may generate an exposure field of light with a specific intensity. However, the light intensity distribution within the exposure field may not be homogeneous. Typically, the intensity of the light in different regions of the exposure field may vary in the range from about 0 to 10%, e.g. in the range of about 1% to about 8%, e.g. in the range of about 2% to about 4%.

Figure 11:
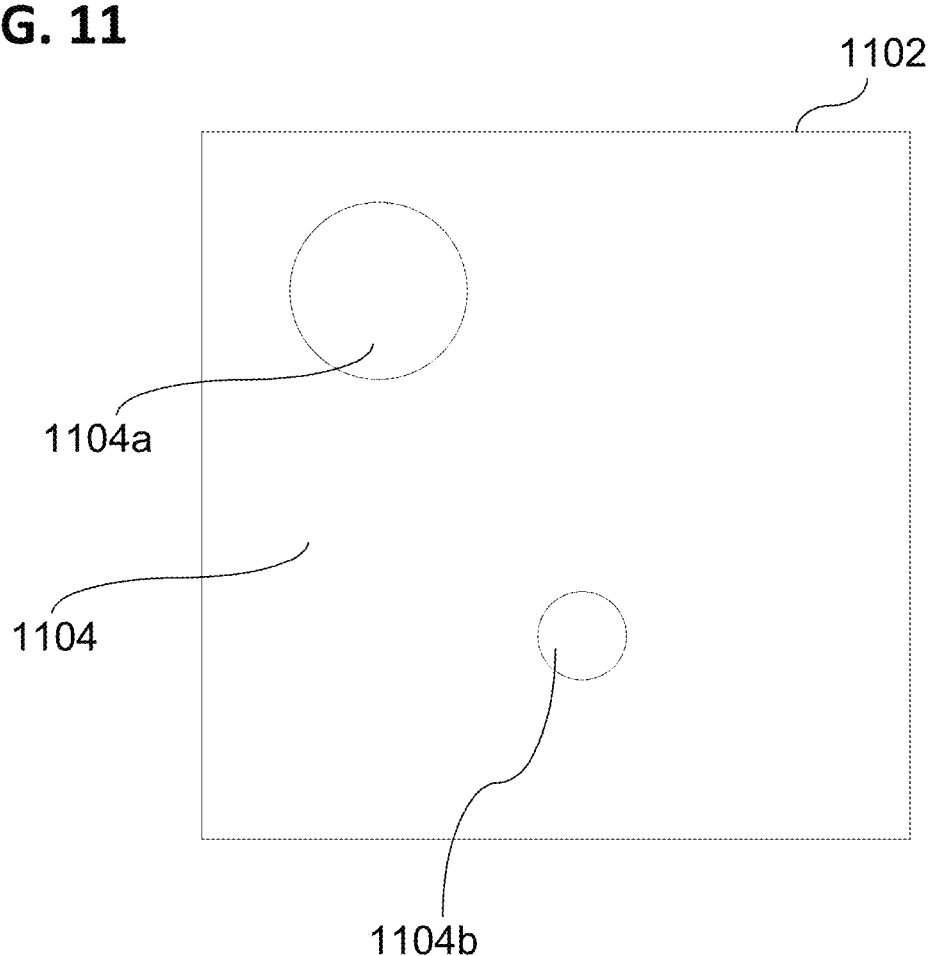
FIG. 11 shows a schematic top view of an inhomogeneous exposure field of an exposure tool.

As schematically shown in FIG. 11, an exposure field 1102 of an exposure tool may include an exposed area 1104, wherein the exposed region 1104 may include at least two regions 1104a, 1104b (also referred to as exposure field regions) being illuminated by light of a different intensity. Therefore, this may result in a general problem, that exposing a mask layer, e.g. a resist layer, using the exposure tool may generate regions in the mask layer being exposed by different exposures doses. The exposure dose depends on the intensity of the light exposing a specific area and the exposure duration. Since the exposure duration for all regions in the exposed area may be the same, e.g. if only one exposure may be performed having a certain exposure duration, the exposure dose, or e.g. the energy input into a mask layer region, may depend on the intensity of the light exposing the mask layer regions. Therefore, if the light intensity in the exposure field may be inhomogeneously distributed, also the exposure dose of the mask layer may be inhomogeneous.

According to various embodiments, the intensity of light in region 1104a of the exposure field 1102 may be greater or smaller than the intensity of light in region 1104b, for example. Therefore, a mask layer region exposed by the region 1104a may be exposed with a different dose than a mask layer region exposed by the region 1104b. Since the exposure dose may be directly correlated to the mask layer thickness after the development of the mask layer (e.g. there may be a linear, logarithmic, or exponential dependence between the exposure dose and the resulting mask layer thickness) there may be the need of a dose correction to enable generating mask layers with a desired homogeneous mask layer thickness across the whole exposed area 1104 of the mask layer.

Figure 15:
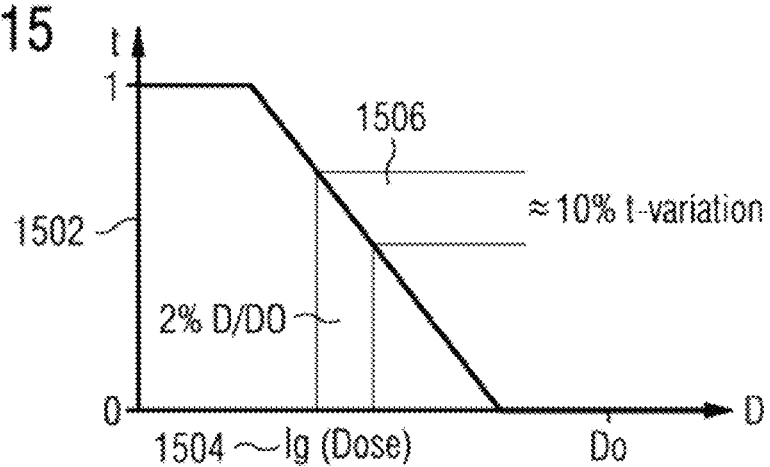
FIG. 15 shows a correlation between exposure dose of a resist layer and the resulting resist layer thickness, according to various embodiments.

FIG. 15 shows a correlation between the exposure dose 1504 and the resulting resist layer thickness 1502, e.g. for exposing a clear i-line resist. As illustrated in the section 1506, a small error in the exposure dose may result in a large error for the resist layer thickness. According to various embodiments, a dose variation of about 2% may generate a resist layer thickness variation of about 10%. According to various embodiments, the correlation between the exposure dose 1504 and the resist layer thickness 1502 may follow a logarithmic dependence, as shown in FIG. 15. According to various embodiments, the resist layer shown in FIG. 15 may include a positive resist.

According to various embodiments, a dose correction compensating light intensity variations within an exposure field may be included in (in other words, achieved by) a lithographic mask, e.g. including gray scale regions to influence the transmitted light in such a way, that these gray scale regions at least partially (e.g. substantially, e.g. exactly) compensate the light intensity variations within the exposure field generated by the exposure tool.

Figure 12:
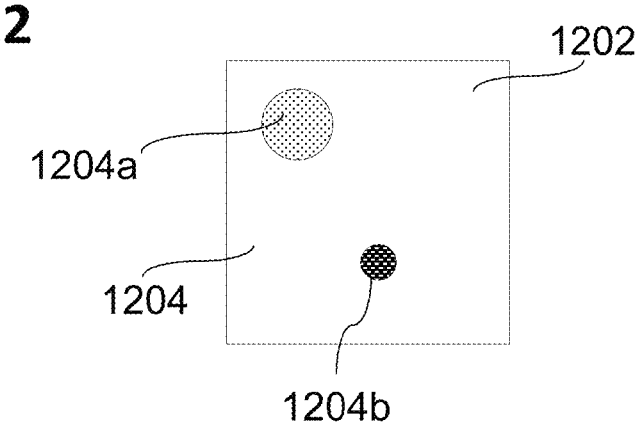
FIG. 12 shows a schematic top view of a gray scale mask for correcting the inhomogeneities in the exposure field of an exposure tool, according to various embodiments.

According to various embodiments, a lithographic mask 1202, e.g. used in an exposure tool to expose a mask layer, may include at least a first lithographic mask region 1204a and a second lithographic mask region 1204b, wherein the first lithographic mask region 1204a and the second lithographic mask region 1204b may include a gray scale pattern, as schematically shown in FIG. 12. A gray scale pattern, as described before, may include sub-resolution features, which may be not directly imaged because the design of the pattern includes distances smaller than the wavelength of the used light for the exposure. The gray scale pattern may include a pixel arrangement, wherein the distances between the pixels and/or the pixel size may be smaller than the wavelength of the used light for the exposure. According to various embodiments, the pixel density may define the ability of transmitting light through the lithographic mask regions 1204a, 1204b.

According to various embodiments, the exposure field region 1104a may be corrected by the lithographic mask region 1204a and/or the exposure field region 1104b may be corrected by the lithographic mask region 1204b, as shown in FIG. 11 and FIG. 12. For example, the lithographic mask region 1204a and/or the lithographic mask region 1204b may be configured such that the exposure field regions 1104a, 1104b obtain the same, or substantially the same, exposure dose even though the light intensity of the exposure tool may be different in the exposure field regions 1104a, 1104b.

According to various embodiments, the lithographic mask region 1204 may also include a gray scale pattern, if desired. In general, the gray scale pattern compensating the light intensity variations in the exposure field may be determined once for a specific exposure tool and may be then transferred or integrated into the desired lithographic mask.

Figure 13:
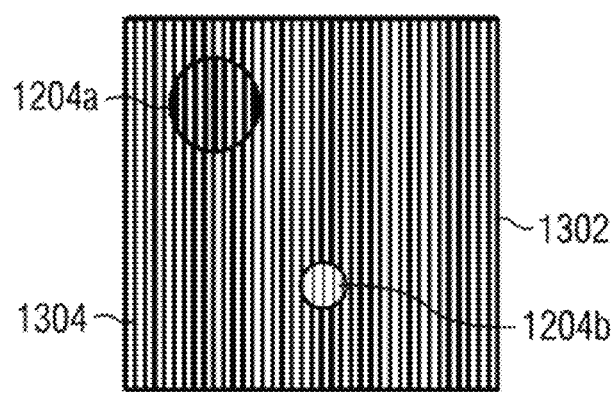
FIG. 13 shows a schematic top view of a gray scale mask for correcting the inhomogeneities in the exposure field of an exposure tool, according to various embodiments.

According to various embodiments, as shown in FIG. 13, a lithographic mask 1302 may include a first lithographic mask pattern 1304, e.g. a first gray scale pattern 1304, for exposing a resist layer to generate a patterned resist layer, e.g. in a way as described above, wherein the lithographic mask 1302 may further include at least one lithographic mask region 1204a, 1204b, wherein the first gray scale pattern 1304 may be adapted to compensate the light intensity variations in the exposure field. Therefore, the gray scale pattern 1304 may be changed to transmit less or more light through the lithographic mask regions 1204a, 1204b, depending on, whether the light intensity shall be increased or reduced in the corresponding regions 1104a, 1104b, of the exposure field 1102. For example, the gray scale pattern 1304 may be adapted to transmit more light through the lithographic mask region 1204a than through the lithographic mask region 1204b, or vice versa.

According to various embodiments, the geometric pattern of the first gray scale pattern 1304 generating for example patterned structures in a mask layer, may not be changed by the adaptation of the lithographic mask regions 1204a, 1204b. In other words, the structures generated in a resist layer may have the same lateral geometry, but the thickness of the resist layer may be corrected by changing the lithographic mask regions 1204a, 1204b to be as desired across the whole exposed area 1104.

According to various embodiments, the first gray scale pattern 1304 may include a first pixel density distribution, e.g. to generate a pattern in the resist layer, which may be convoluted with a dose correction pixel density distribution, changing the first pixel density distribution such that the transmitted light intensity is adapted to compensate intensity variations or deviations in the exposure field created by the exposure tool. In other words, a dose correction gray scale pattern may be overlaid over the gray scale pattern 1304 to compensate light intensity variations in the exposure field.

According to various embodiments, the lithographic mask described with reference to FIG. 11, FIG. 12 and FIG. 13 may be included in the method for processing a carrier or in a method for manufacturing an electronic device, as described herein.

According to various embodiments, using such a corrected gray scale mask in a method for processing a carrier, as described before, may enable the manufacturing of electronic devices, as described herein, having the same shape across the whole exposed area 1104, and therefore, light intensity variations in the exposure field may not influence the manufacturing process.

According to various embodiments, the light intensity variations in the exposure field may be spatial light intensity variations, e.g. lateral light intensity variations, as schematically shown in FIG. 11.

According to various embodiments, the first pattern 1304 may include a conventional pattern used to expose a resist layer in a desired design, e.g. to generate a pattern in the resist layer, and this conventional pattern may be convoluted or overlaid with a gray scale pattern, as described herein, enabling the dose correction, e.g. by adapting the conventional pattern such that the transmitted light intensity is changed to compensate intensity errors in the exposure field created by the exposure tool. In other words, a dose correction gray scale pattern may be overlaid over a conventional pattern of a lithographic mask to compensate light intensity variations in the exposure field.

Figure 14:
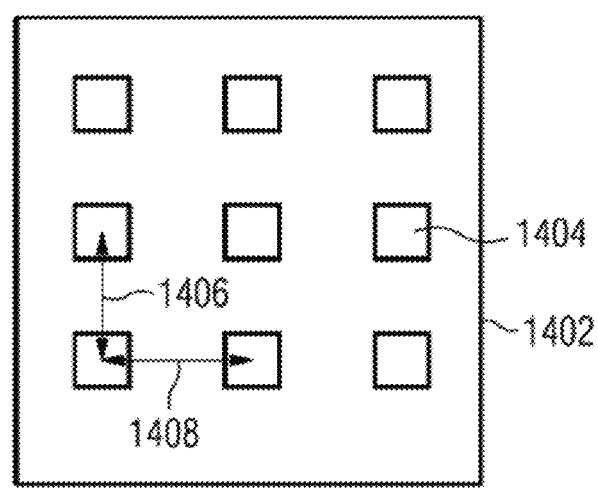
FIG. 14 shows a schematic top view of a sub-resolution feature of a gray scale mask, according to various embodiments.

According to various embodiments, FIG. 14 shows a schematic view of a gray scale pattern 1402, wherein the size of the features 1404 and/or the distances 1406, 1408 between the features 1404 may be smaller than the wavelength of the light being used for the exposure. According to various embodiments, since the wavelength of the used light may be in the range of several hundred nanometers, the size of the features 1404 and/or the distances 1406, 1408 between the features 1404 may be smaller than several hundred nanometers accordingly. According to various embodiments, the specific arrangement of the features 1404 may be adapted to the specific pattern, which should be generated in the resist layer. According to various embodiments, the feature density, or the pixel density, may result from the specific arrangement of the features 1404 or pixels 1404 including the size and the distance 1406, 1408.

According to various embodiments, a method for processing a carrier may include changing a three-dimensional structure of a mask layer arranged over the carrier so that at least two mask layer regions may be formed having different mask layer thicknesses; and applying an ion implantation process to the at least two mask layer regions to form at least two implanted regions in the carrier having different implantation depth profiles.

According to various embodiments, a method for processing a carrier may include changing a three-dimensional structure of a mask layer arranged over the carrier so that at least one mask layer region may be formed having an arbitrary shape including at least two different mask layer thicknesses; and applying an ion implantation process to the at least one mask layer region to form at least one implanted region in the carrier having an implantation depth profile including at least two different implantation depths.

It should be noted, since an implantation depth profile may due to the straggling of the ions may naturally include ions having a different implantation depth, the term "implantation depth" as used herein may be the distance of maximum of the implantation concentration depth profile to the upper surface of the carrier. Therefore, the term "projected range" as used herein may be the distance of maximum of the implantation concentration depth profile to the upper surface mask layer. According to various embodiments, the projected range may therefore be equal to the implantation depth if the mask layer thickness is zero. According to various embodiments, the projected range minus the mask layer thickness may be the implantation depth of the ions.

According to various embodiments, the ions may be implanted from a direction perpendicular to the surface of the carrier. According to various embodiments, the ions may be implanted from a direction with a tilt against the direction perpendicular to the surface of the carrier, wherein the tilt may be in the range of about 0° to about 45°, e.g. in the range of about 45°, e.g. in the range of about 3° to about 10°.

According to various embodiments, changing the three-dimensional structure of the mask layer may include changing the three-dimensional structure of a resist layer.

According to various embodiments, the mask layer may be a resist layer (e.g. a photoresist layer).

According to various embodiments, changing the three-dimensional structure of the mask layer may include changing the three-dimensional structure of a hard mask layer.

According to various embodiments, the mask layer may be a hard mask layer.

According to various embodiments, the resist layer or the mask layer may include a single type of resist. That means that forming the mask layer may include only one mask material.

According to various embodiments, the mask layer may be a positive photoresist layer.

According to various embodiments, changing the three-dimensional structure of the mask layer may include changing the three-dimensional structure of a positive photoresist layer.

According to various embodiments, the resist layer or the positive photoresist layer may include a single type of resist. That means that forming the mask layer may include only one type of mask material or only one type of photoresist.

According to various embodiments, a method for processing a carrier may further include forming at least one electronic device including at least one of the at least two implanted regions.

According to various embodiments, a method for processing a carrier may further include forming at least one electronic device including the at least one implanted region.

According to various embodiments, an implanted region may also be referred to as doped region. According to various embodiments, a material for a doping process may be referred to as dopant material.

According to various embodiments, changing the three-dimensional structure of the mask layer may include at least one lithographic process, wherein the at least two mask layer regions may be formed using different exposures for each of the at least two mask layer regions. According to various embodiments, changing the three-dimensional structure of the mask layer may include at least one lithographic process, wherein the at least one mask layer region may be formed using an exposure profile for the at least one mask layer region, wherein the exposure profile may include different exposures.

According to various embodiments, an exposure may include the introduction of a specific amount of energy, therefore, mask layer regions being formed using different exposures may include different introduced amounts of energy.

According to various embodiments, changing the three-dimensional structure of the mask layer may include at least one lithographic process, wherein a plurality of mask layer regions may be formed using different exposures for each of the plurality of mask layer regions.

According to various embodiments, the term "three-dimensional structure of a mask layer" as used herein may be used herein for example to mean the shape of the upper surface of the mask layer, wherein the shape of the upper surface of the mask layer may be defined by the distance to the surface of the underlying carrier.

According to various embodiments, changing the three-dimensional structure of the mask layer may include forming at least one mask layer region to form one of a step-wise and gradual (in other words a continuous, e.g. a linear decreasing or a linear increasing) change of the thickness of the mask layer (e.g. along at least one direction parallel to the surface of the carrier).

According to various embodiments, changing the three-dimensional structure of the mask layer may include exposing at least two regions of a photoresist layer arranged over the carrier using ultraviolet light of different intensities.

According to various embodiments, changing the three-dimensional structure of the mask layer may include exposing the at least one region of a photoresist layer, which may be arranged over the carrier, using ultraviolet light.

According to various embodiments, the exposure included in a lithographic process may include using electromagnetic radiation, e.g. light, e.g. ultraviolet light, or particles, e.g. electrons.

According to various embodiments, the mask layer may be a positive photoresist, such that the portion of the photoresist that is unexposed remains after the developing of the photoresist using a photoresist developer.

According to various embodiments, changing the three-dimensional structure of the mask layer may include forming at least a first mask layer region including a gradual or a continuous decrease of the thickness of the mask layer along a predefined direction parallel to the surface of the carrier and at least a second mask layer region including a gradual or a continuous increase of the thickness of the mask layer along the same direction. According to various embodiments, changing the three-dimensional structure of the mask layer may include forming a V-shape mask layer, according to the cross-sectional view. According to various embodiments, changing the three-dimensional structure of the mask layer may include forming a U-shape mask layer, according to the cross-sectional view. According to various embodiments, changing the three-dimensional structure of the mask layer may include forming a mask layer with a circular shape, according to the cross-sectional view.

According to various embodiments, a continuous change of the resist layer thickness along the first direction may include a linear dependence; that means that the change of the resist layer thickness is direct proportional to the distances along the first direction.

According to various embodiments, a continuous change of the resist layer thickness along the first direction may include any other mathematical dependence, as for example polynomial, exponential and the like.

According to various embodiments, a step-wise change of the resist layer thickness along the first direction may include a constant step height in at least part of the mask layer region. According to various embodiments, the step size may be defined by the wavelength of the used light, since the gray scale mask may be limited to a maximal possible spatial resolution.

According to various embodiments, changing the three-dimensional structure of the mask layer may include a lithographic process using a single lithographic mask for exposing the at least two mask layer regions with different exposures for each of the at least two mask layer regions.

According to various embodiments, changing the three-dimensional structure of the mask layer may include a lithographic process using a single lithographic mask for exposing the at least one mask layer region with different exposures for the respective mask layer region.

According to various embodiments, a lithographic mask, e.g. a gray scale mask, may include at least a first lithographic mask region and a second lithographic mask region, wherein the optical transmittance provided by the first lithographic mask region is different from the optical transmittance provided by the second lithographic mask region. According to various embodiments, the term "gray scale" as used herein referring to a gray scale mask or gray scale lithography may have the meaning that an optical transmittance through a region or lithographic mask region is not zero and not 100%. In other words, the mask may not only produce white (e.g. the maximal transmittance of the lithographic mask) and black (the minimal transmittance of the lithographic mask), but also a transmittance in between black and white (different shades of gray), e.g. in the range of 1% to 99% of the possible transmittance range of the lithographic mask.

According to various embodiments, the lithographic mask may include at least a first lithographic mask region and a second lithographic mask region, wherein the optical transmittance provided by the first lithographic mask region may be different from the optical transmittance provided by the second lithographic mask region, wherein the optical transmittances are not zero.

According to various embodiments, as described herein, a zero optical transmittance may not be regarded as transmittance, since no light is transmitted.

According to various embodiments, the lithographic mask may include regions having different optical transmittances (e.g. different shades of gray); therefore, the lithographic mask may be referred to as gray scale mask.

According to various embodiments, the single lithographic mask may include a lithographic pixel mask having at least two different pixel mask regions to expose the at least two different mask layer regions with different exposures.

According to various embodiments, at least one of the at least two different pixel mask regions of the lithographic pixel mask is adapted to compensate light intensity variations of an exposure tool.

According to various embodiments, the single lithographic mask may include a lithographic pixel mask having an inhomogeneous pixel density to expose the mask layer region with different exposures. According to various embodiments, a pixel of a pixel mask may be a small region on a mask carrier, wherein for example the lateral extension may be smaller than the wavelength of the used light for exposing the mask layer, and wherein the small region on a mask carrier may have zero optical transmittance. According to various embodiments, a pixel of a pixel mask may be a small metallic region, e.g. a chromium dot, on a glass carrier. According to various embodiments, the distance between the adjacent metallic regions may define the optical transmittance of the lithographic mask region having then a specific pixel density.

According to various embodiments, changing the three-dimensional structure of the mask layer may include changing the three-dimensional structure of a resist layer by exposing at least two regions of the resist layer with light or particles having different intensities.

According to various embodiments, changing the three-dimensional structure of the mask layer may include changing the three-dimensional structure of a resist layer by exposing at least two regions of the resist layer with light or particles using different exposure durations.

According to various embodiments, the resist layer may have a thickness in the range from about 0 µm to about 100 µm, e.g. in the range from about 5 nm to about 10 µm, e.g. in the range from about 0 µm to about 5 µm, e.g. a thickness of about 5 µm.

According to various embodiments, the ion implantation process may include implanting ions simultaneously through the at least two mask layer regions.

According to various embodiments, the ion implantation process may include implanting ions simultaneously through the patterned mask layer regions.

According to various embodiments, the ion implantation process may include implanting ions simultaneously through the mask layer.

According to various embodiments, the ion implantation process may include an ion implantation process using ions having a kinetic energy in the range of about 50 keV to about 10 MeV, e.g. in the range of about 300 keV to about 5 MeV, e.g. in the range from about 2 MeV to about 8 MeV.

According to various embodiments, the ion implantation process may include an ion implantation process using ions having a kinetic energy smaller than about 2 MeV or larger than about 8 MeV.

According to various embodiments, the ion implantation process may generate a doping profile in the carrier in accordance to the shape of the three-dimensional structure of the mask layer.

According to various embodiments, a method for processing a carrier may include patterning a resist layer using at least one of gray scale lithography and maskless gray scale lithography, applying an ion implantation process using the patterned resist layer as masking layer. According to various embodiments, maskless gray scale lithography may include exposing different regions of the mask layer with light or particles of different intensity.

According to various embodiments, a carrier may include a doping profile comprising implanted ions, wherein the doping profile is generated by changing the three-dimensional structure of a mask layer arranged over the carrier so that at least two mask layer regions are formed having different mask layer thicknesses; and applying an ion implantation process to the at least two mask layer regions to form at least two implanted regions in the carrier having different implantation depth profiles.

According to various embodiments, a carrier may include implanted material in a first region of the carrier, wherein the implantation depth of the implanted material in the first region of the carrier may be continuously substantially linearly changing along a predefined direction parallel to the surface of the carrier.

According to various embodiments, the carrier may further include implanted material in a second region of the carrier, wherein the implantation depth of the implanted material in the second region of the carrier may be step-wise or gradually increasing along the predefined direction parallel to the surface of the carrier.

According to various embodiments, the spatial distribution of the implanted material in the carrier may have a Gaussian dependence at least for the material distribution along a direction parallel to the implantation direction. According to various embodiments, the doping distribution is substantially caused by electronic stopping and nuclear stopping of the incident ions during ion implantation. According to various embodiments, the concentration of the dopant material in a direction parallel to the direction with the maximal concentration gradient may have a Gaussian dependence or an approximately Gaussian dependence.

According to various embodiments, the spatial distribution of the implanted material may include regions having the same implanted material concentration (regions of equivalent doping concentration), wherein the regions having the same implanted material concentration may form planar layers being not perpendicular to the implantation direction and not parallel to the surface of the carrier.

According to various embodiments, an electronic device may include a carrier including: implanted material in a first region of the carrier, wherein the implantation depth of the implanted material in the first region of the carrier is continuously substantially linearly changing along a predefined direction parallel to the surface of the carrier. According to various embodiments, an electronic device may include a carrier including: implanted material in a first region of the carrier, wherein the implantation depth of the implanted material in the first region of the carrier is continuously changing along a predefined direction parallel to the surface of the carrier.

According to various embodiments, the electronic device may be configured as a transistor. According to various embodiments, the electronic device may be configured as a diode, an optical sensor, a strain sensor, or a magnetic field sensor.

According to various embodiments, the spatial distribution of the implanted material in carrier of an electronic device may include regions having the same implanted material concentration, wherein the regions having the same implanted material concentration may form planar layers, which are not perpendicular to the implantation direction and not parallel to the surface of the carrier.

According to various embodiments, using method 100, as described herein, may enable forming a plurality of electronic devices using a single lithographic process, wherein the electronic devices of the plurality of electronic devices may differ in their doping profile, e.g. in the implantation depth of the respectively implanted dopant material.

According to various embodiments, the ion implantation process may include a plurality of ion implantation processes with different kinetic energies, e.g. a series of ion implantation processes performed with different ion energies respectively.

According to various embodiments, changing the three-dimensional structure of a mask layer may include an exposure using more than one lithographic mask, e.g. a plurality of lithographic masks, wherein at least one mask may be a gray scale mask, wherein in this case the photoresist may be developed after the multi mask exposure has been carried out.

According to various embodiments, using the method for processing a carrier, as described herein, may allow the preparation of three-dimensional lithographic structures with more than 20 different resist thicknesses within one exposure shot.

According to various embodiments, using method for processing a carrier, as described herein, may allow an improved control and placement of implant dose with standard implant process.

According to various embodiments, the mask layer may include or may consist of i-line photoresist.

According to various embodiments, the method for processing a carrier, as described herein, may not need an additional temperature process steps.

According to various embodiments, using method for processing a carrier, as described herein, may prevent non correctable overlay errors due to wafer warpage after a temperature process.

According to various embodiments, using method for processing a carrier, as described herein, may allow new device architectures.

According to various embodiments, the dopant material may be phosphor.

According to various embodiments, the dopant material profile (or the dopant species distribution) may be strongly confined and may maximize at a certain distance below the carrier surface.

According to various embodiments, a lithographic mask may include a convolution of a first lithographic mask pattern and a second lithographic mask pattern, wherein the first lithographic mask pattern may be designed for exposing a mask layer, to generate a desired patterned mask layer, and the second lithographic mask pattern may be designed to compensate light intensity variations of an exposure tool.

According to various embodiments, the mask layer may include a photosensitive layer, e.g. a resist layer.

According to various embodiments, the light intensity variations may be light intensity variations in an exposure field resulting from the exposure tool.

According to various embodiments, the light intensity variations may be spatial light intensity variations.

According to various embodiments, the second lithographic mask pattern may include a gray scale pattern.

According to various embodiments, the gray scale pattern may include at least one gray scale pattern region, to increase or decrease an intensity of light generated by the exposure tool to expose a mask layer region.

According to various embodiments, the first lithographic mask pattern and the second lithographic mask pattern may each include a gray scale pattern and the lithographic mask may include a resulting corrected gray scale pattern such that the light intensity variations in the exposure field are compensated.

According to various embodiments, a lithographic gray scale mask may include a gray scale pattern designed for exposing a resist layer, to generate a desired resist layer pattern, wherein the gray scale pattern may be adapted to additionally compensate light intensity variations in an exposure field resulting from an exposure tool.

According to various embodiments, the gray scale pattern may include sub-resolution features, wherein a spatial density of the sub-resolution features may be adapted to compensate the light intensity variations in the exposure field resulting from the exposure tool.

According to various embodiments, a lithographic exposure arrangement may include an exposure tool, the exposure tool may be configured to generate an exposure field, wherein the exposure field may include at least two regions having different light intensities, a gray scale mask, the gray scale mask including: a gray scale pattern designed for exposing a resist layer, to generate a desired resist layer pattern, wherein the gray scale pattern may include at least one region that is adapted to compensate the different light intensities in the at least two regions of the exposure field.

According to various embodiments, the gray scale pattern may include a plurality sub-resolution pixel, as described before, wherein a spatial density of the sub-resolution features may be adapted to compensate light intensity variations in the exposure field generated by the exposure tool.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A carrier, the carrier comprising,
 a doping profile comprising implanted ions, wherein the doping profile is generated by
  changing the three-dimensional structure of a mask layer arranged over the carrier so that at least two mask layer regions are formed having different mask layer thicknesses, wherein changing the three-dimensional structure of the mask layer comprises forming at least a first mask layer region comprising a gradual decrease of the thickness of the mask layer along a predefined direction parallel to a surface of the carrier and at least a second mask layer region comprising a gradual increase of the thickness of the mask layer along the same direction; and
  applying an ion implantation process to the at least two mask layer regions to form at least two implanted regions in the carrier having different implantation depth profiles.

2. A carrier, the carrier comprising,
 implanted material in a first region of the carrier, wherein the implantation depth of the implanted material in the first region of the carrier is continuously substantially linearly decreasing along a predefined direction parallel to the surface of the carrier; and
 implanted material in a second region of the carrier, wherein the implantation depth of the implanted material in the second region of the carrier is continuously substantially linearly increasing along the predefined direction.

3. The carrier according to claim 2,
 wherein the spatial distribution of the implanted material has a Gaussian dependence at least for the material distribution along a direction parallel to the implantation direction.

4. The carrier according to claim 2,
 wherein the spatial distribution of the implanted material includes regions having the same implanted material concentration, wherein the regions having the same implanted material concentration form planar layers, which are not perpendicular to the implantation direction and not parallel to the surface of the carrier.

5. An electronic device, comprising:
 a carrier comprising:
  implanted material in a first region of the carrier, wherein the implantation depth of the implanted material in the first region of the carrier is continuously substantially linearly decreasing along a predefined direction parallel to the surface of the carrier; and implanted material in a second region of the carrier, wherein the implantation depth of the implanted material in the second region of the carrier is continuously substantially linearly increasing along the predefined direction.

6. The electronic device of claim 5, being configured as at least one of transistor, a diode, an optical sensor, a strain sensor, and a hall sensor.

7. The electronic device of claim 5,
wherein the spatial distribution of the implanted material includes regions having the same implanted material concentration, wherein the regions having the same implanted material concentration form planar layers which are not perpendicular to the implantation direction and not parallel to the surface of the carrier.

8. The electronic device of claim 5,
wherein the implanted material in the first region of the carrier and the implanted material in the second region of the carrier form a V-shaped doped region.

9. The electronic device of claim 8, further comprising:
implanted contact regions for contacting the V-shaped doped region.

10. The electronic device of claim 9,
wherein the contact regions form at least one V-shaped doped contact region.

11. The electronic device of claim 10,
wherein the at least one V-shaped doped contact region is aligned perpendicular to the V-shaped doped region.

* * * * *